US012672463B2

(12) United States Patent (10) Patent No.: US 12,672,463 B2
Tanaka (45) Date of Patent: Jun. 30, 2026

(54) DISPLAY DEVICE

(71) Applicant: Sharp Display Technology Corporation, Kameyama City (JP)

(72) Inventor: Yuji Tanaka, Sakai City (JP)

(73) Assignee: Sharp Display Technology Corporation, Kameyama City (JP)

( * ) Notice: Subject to any disclaimer, the term of this patent is extended or adjusted under 35 U.S.C. 154(b) by 0 days.

(21) Appl. No.: 19/105,166

(22) PCT Filed: Oct. 12, 2022

(86) PCT No.: PCT/JP2022/038082
§ 371 (c)(1),
(2) Date: Feb. 20, 2025

(87) PCT Pub. No.: WO2024/079821
PCT Pub. Date: Apr. 18, 2024

(65) Prior Publication Data
US 2026/0047311 A1 Feb. 12, 2026

(51) Int. Cl.
*H10K 59/60* (2023.01)
*G01J 1/44* (2006.01)
*G09G 3/20* (2006.01)
*G09G 3/3208* (2016.01)
*H10K 50/115* (2023.01)

(52) U.S. Cl.
CPC .............. *H10K 59/60* (2023.02); *G01J 1/44* (2013.01); *G09G 3/2007* (2013.01); *G09G 3/3208* (2013.01); *H10K 50/115* (2023.02); *G09G 2320/0233* (2013.01); *G09G 2320/0242* (2013.01); *G09G 2320/045* (2013.01); *G09G 2330/02* (2013.01)

(58) Field of Classification Search
CPC .. G09G 3/3233; G09G 3/3291; G09G 3/3266; G09G 3/3258; G09G 3/3208; G09G 3/3648; G09G 2320/043; G09G 2320/0233; G09G 2320/045; G09G 2320/0295; G09G 2320/029; G09G 2320/0626; G09G 2320/0285; G09G 2320/041; G09G 2320/0693; G09G 2300/0842; G09G 2300/0819; G09G 2300/0426; G09G 2300/0861; G09G 2300/0852; G09G 2360/145; G09G 2360/16; G09G 2360/144; G09G 2310/08
See application file for complete search history.

(56) References Cited

U.S. PATENT DOCUMENTS

| | | | |
|---|---|---|---|
| 2004/0032382 A1* | 2/2004 | Cok ..................... G09G 3/3216 345/82 |
| 2011/0204795 A1 | 8/2011 | Uehara |
| 2019/0259890 A1* | 8/2019 | Lu ........................... H10F 30/10 |
| 2019/0363792 A1* | 11/2019 | Tsonev ..................... G06T 1/00 |
| 2020/0175902 A1* | 6/2020 | Huang ................. G09G 3/3225 |

(Continued)

FOREIGN PATENT DOCUMENTS

JP      H09198007 A      7/1997
JP      2011-170219 A      9/2011

*Primary Examiner* — Dong Hui Liang
(74) *Attorney, Agent, or Firm* — ScienBiziP, P.C.

(57) ABSTRACT

A display device includes: a display panel including a plurality of light-emitting elements; at least one solar cell receiving light from the plurality of light-emitting elements; and a measuring unit measuring output from the at least one solar cell.

9 Claims, 13 Drawing Sheets

(56)     References Cited

U.S. PATENT DOCUMENTS

| | | | |
|---|---|---|---|
| 2022/0366846 A1* | 11/2022 | Chang | G09G 3/3225 |
| 2023/0070335 A1* | 3/2023 | Park | G09G 3/2092 |
| 2023/0157126 A1* | 5/2023 | Jinta | H05B 33/12 |
| | | | 257/40 |

* cited by examiner

| 2R | 2R | | |
|---|---|---|---|
| 5.2 | 5.4 | 5.5 | 5.2 |
| 5.3 | 5.6 | 5.6 | 5.4 |
| 5.1 | 5.4 | 5.5 | 5.2 |
| 4.9 | 5.2 | 5.3 | 5.0 |

2B

| 2R | 2R | 2RM | |
|---|---|---|---|
| 5.0 | 5.2 | 5.3 | 5.1 |
| 5.2 | 5.3 | 5.2 | 5.2 |
| 4.9 | 5.1 | 5.2 | 5.0 |
| 4.7 | 5.0 | 5.0 | 4.8 |

2C

| 2R | 2R | 2RM | |
|---|---|---|---|
| ×0.966 4.83 | ×0.964 5.01 | ×0.964 5.11 | ×0.947 4.83 |
| ×0.946 4.92 | ×0.981 5.20 | ×1.000 5.20 | ×0.964 5.01 |
| ×0.966 4.74 | ×0.983 5.01 | ×0.982 5.11 | ×0.966 4.83 |
| ×0.968 4.55 | ×0.966 4.83 | ×0.984 4.92 | ×0.967 4.64 |

FIG. 9
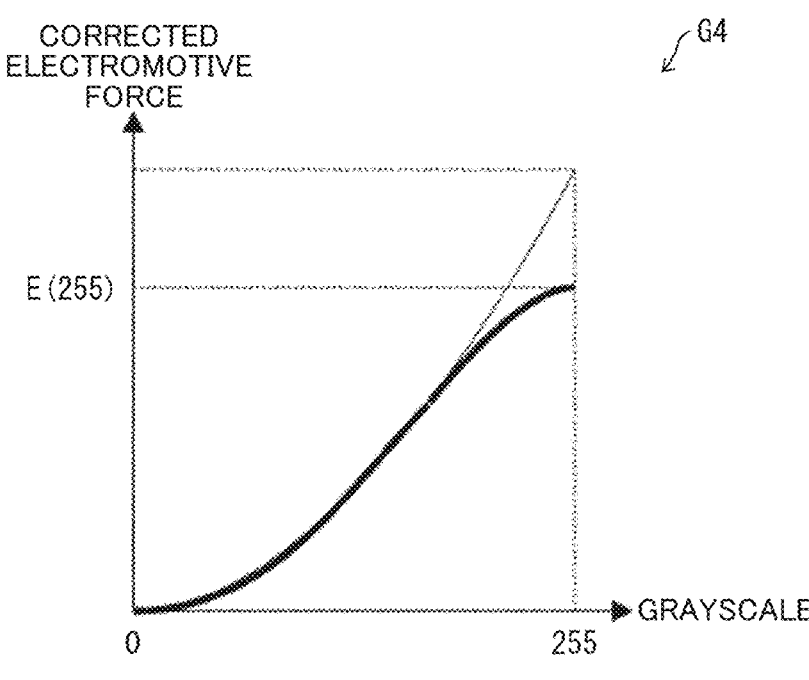
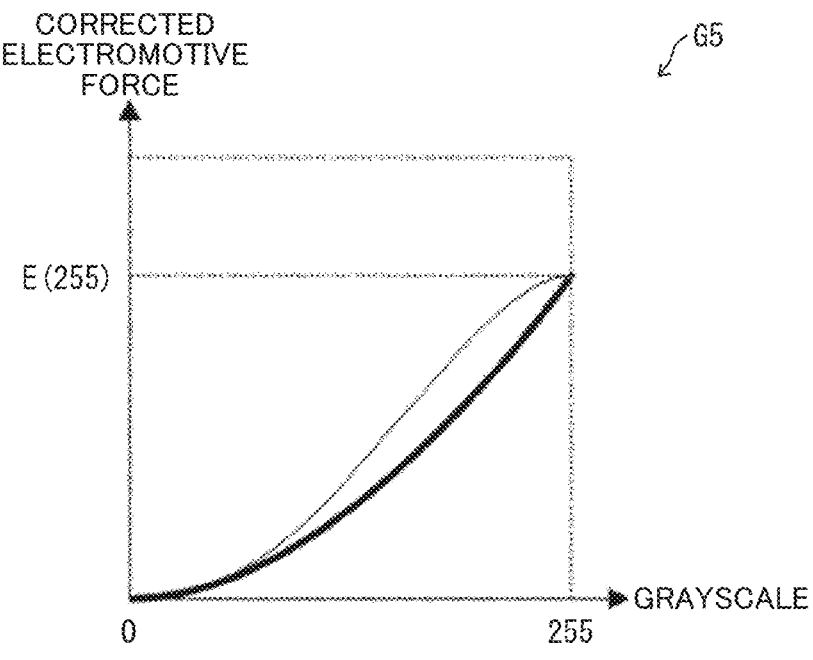

FIG. 10

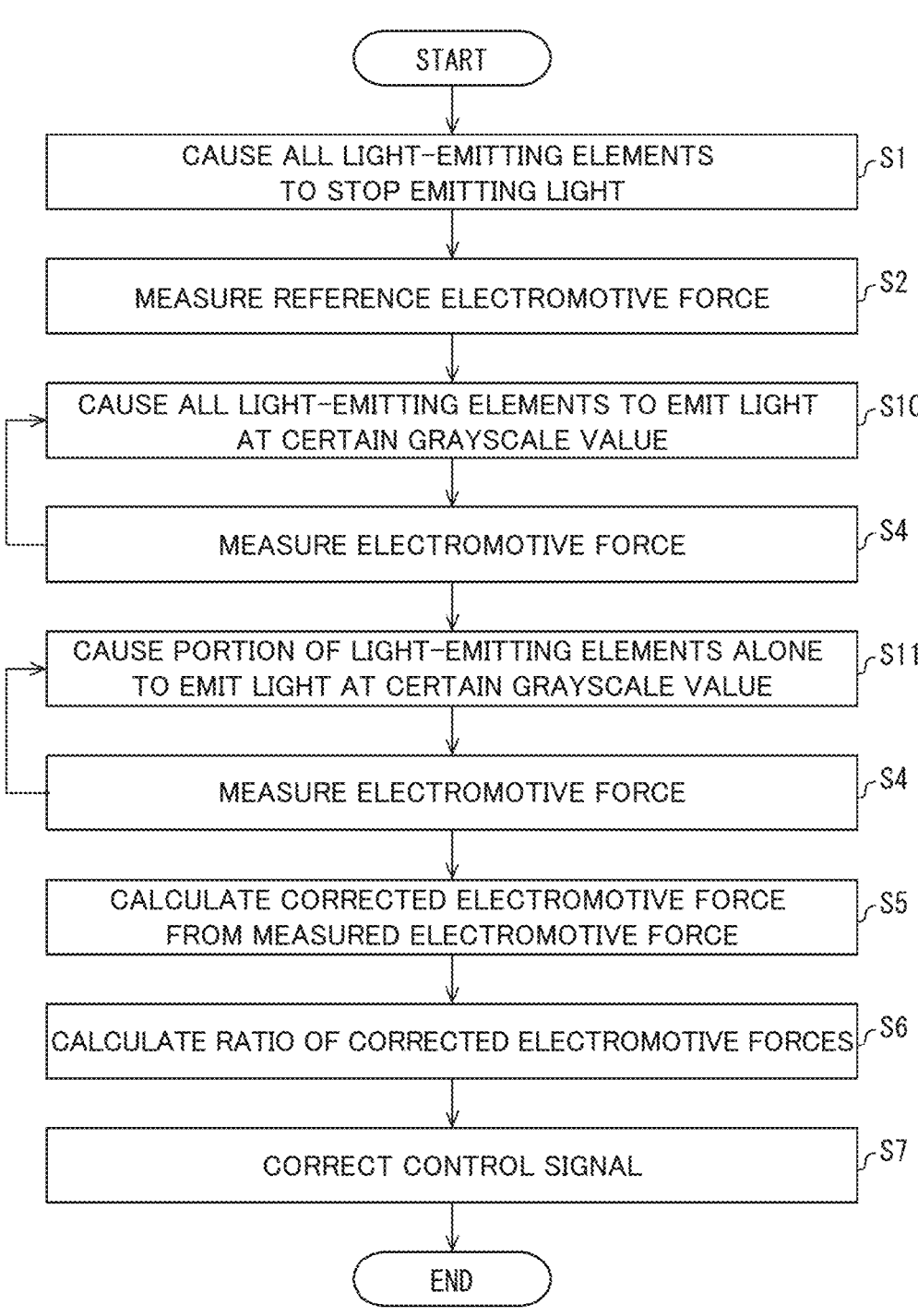

START

CAUSE ALL LIGHT-EMITTING ELEMENTS TO STOP EMITTING LIGHT — S1

MEASURE REFERENCE ELECTROMOTIVE FORCE — S2

CAUSE ALL LIGHT-EMITTING ELEMENTS TO EMIT LIGHT AT CERTAIN GRAYSCALE VALUE — S10

MEASURE ELECTROMOTIVE FORCE — S4

CAUSE PORTION OF LIGHT-EMITTING ELEMENTS ALONE TO EMIT LIGHT AT CERTAIN GRAYSCALE VALUE — S11

MEASURE ELECTROMOTIVE FORCE — S4

CALCULATE CORRECTED ELECTROMOTIVE FORCE FROM MEASURED ELECTROMOTIVE FORCE — S5

CALCULATE RATIO OF CORRECTED ELECTROMOTIVE FORCES — S6

CORRECT CONTROL SIGNAL — S7

END

FIG. 11
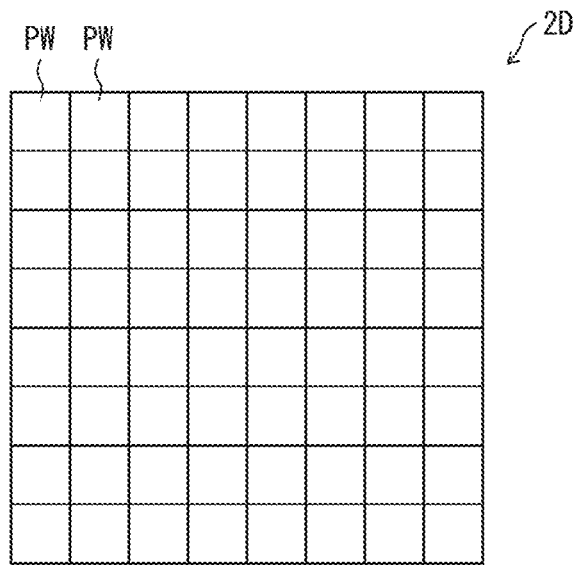
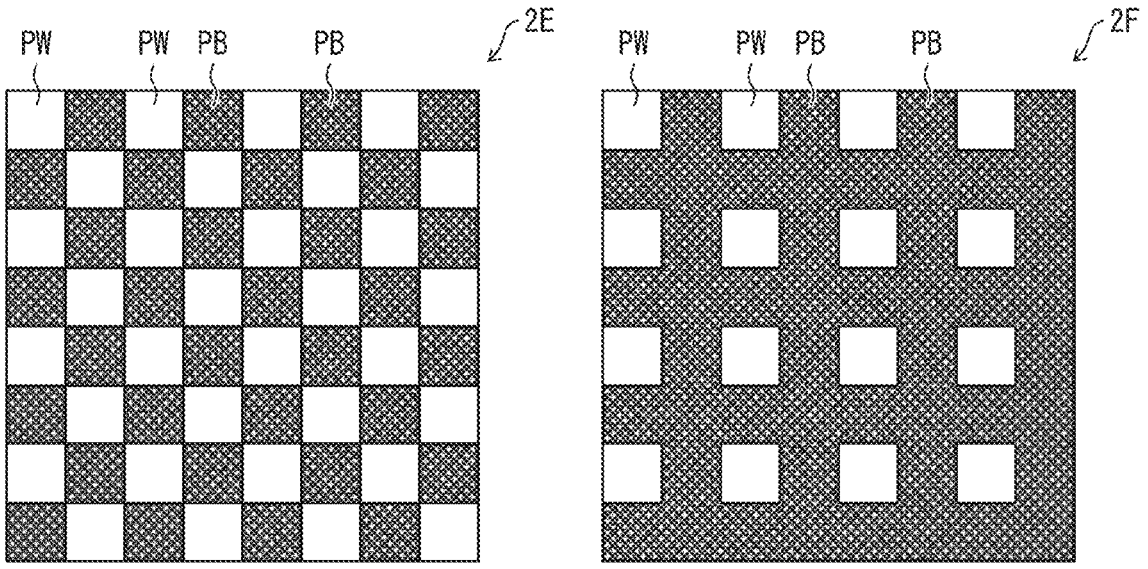

FIG. 12
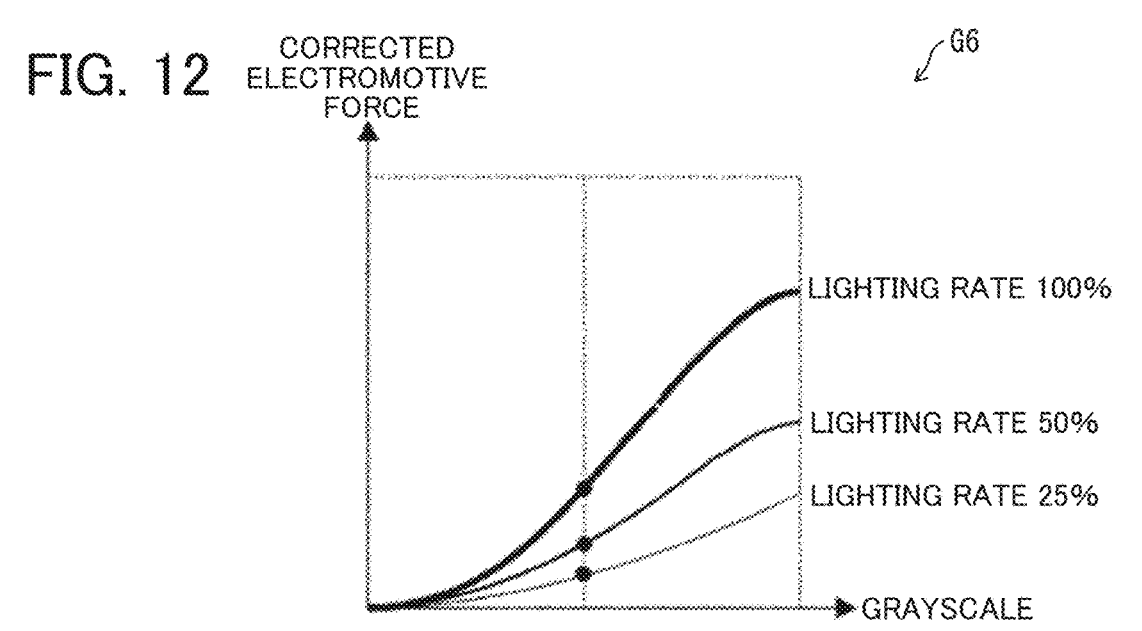
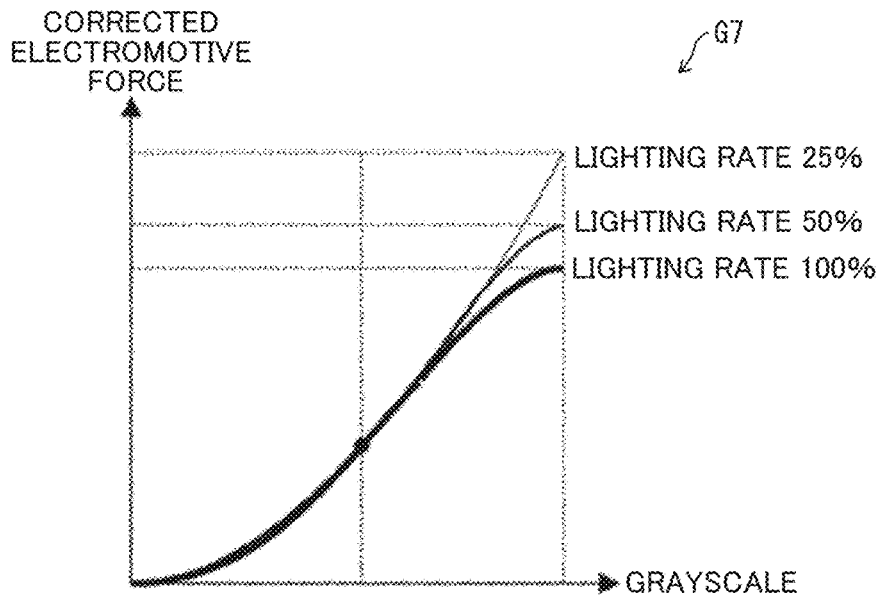
FIG. 13
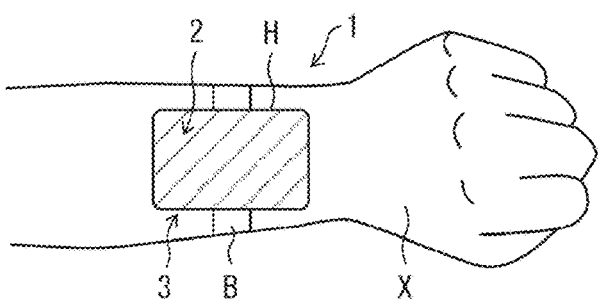

DISPLAY DEVICE

TECHNICAL FIELD

The present disclosure relates to a display device including a plurality of light-emitting elements.

BACKGROUND ART

Patent Document 1 discloses a technique to correct variations in light luminance among display elements of a display device, using a solar cell.

CITATION LIST

Patent Literature

[Patent Document 1] Japanese Unexamined Patent Application Publication No. 09-198007

SUMMARY

Technical Problems

As to a typical display device including a plurality of light-emitting elements, the light-emitting elements deteriorate with time. The time-related deterioration would vary, depending on the light-emitting elements. The technique described in Patent Document 1 could measure the variations in light luminance of the display device at the time of shipment; however, the technique has difficulty in measuring variations in light luminance caused by differences in time-related deterioration among the light-emitting elements of the display device.

Solution to Problems

A display device according to an embodiment of the present disclosure includes: a display panel including a plurality of light-emitting elements; at least one solar cell that receives light from the plurality of light-emitting elements; and a measuring unit that measures output from the at least one solar cell.

A method for controlling a display device according to an embodiment of the present disclosure is directed to a display device including: a display panel including a plurality of light-emitting elements; and at least one solar cell receiving light from at least the plurality of light-emitting elements. The method includes measuring output from the at least one solar cell.

Time-related deterioration of a plurality of light-emitting elements included in a display device can be measured.

BRIEF DESCRIPTION OF DRAWINGS

FIG. 6 illustrates a schematic view of a display panel according to a second embodiment, showing an exemplary relationship between a corrected electromotive force and each of the regions of the display panel.

FIG. 9 illustrates graphs showing an exemplary relationship between a corrected electromotive force and a grayscale value of each of the light-emitting elements of a display panel according to the fourth embodiment.

FIG. 10 shows a flowchart showing an example of a method for controlling a display device according to a fifth embodiment.

FIG. 11 illustrates a schematic plan view of a display panel according to the fifth embodiment, showing a lighting rate of the display device.

FIG. 12 illustrates graphs showing, for each lighting rate of the display panel, an exemplary relationship between a corrected electromotive force and a grayscale value of each of the light-emitting elements of the display panel according to the fifth embodiment.

FIG. 13 illustrates a schematic view showing an example of how a human body is wearing a display device according to a sixth embodiment.

DESCRIPTION OF EMBODIMENTS

First Embodiment

Overview of Display Device

Figure 1:
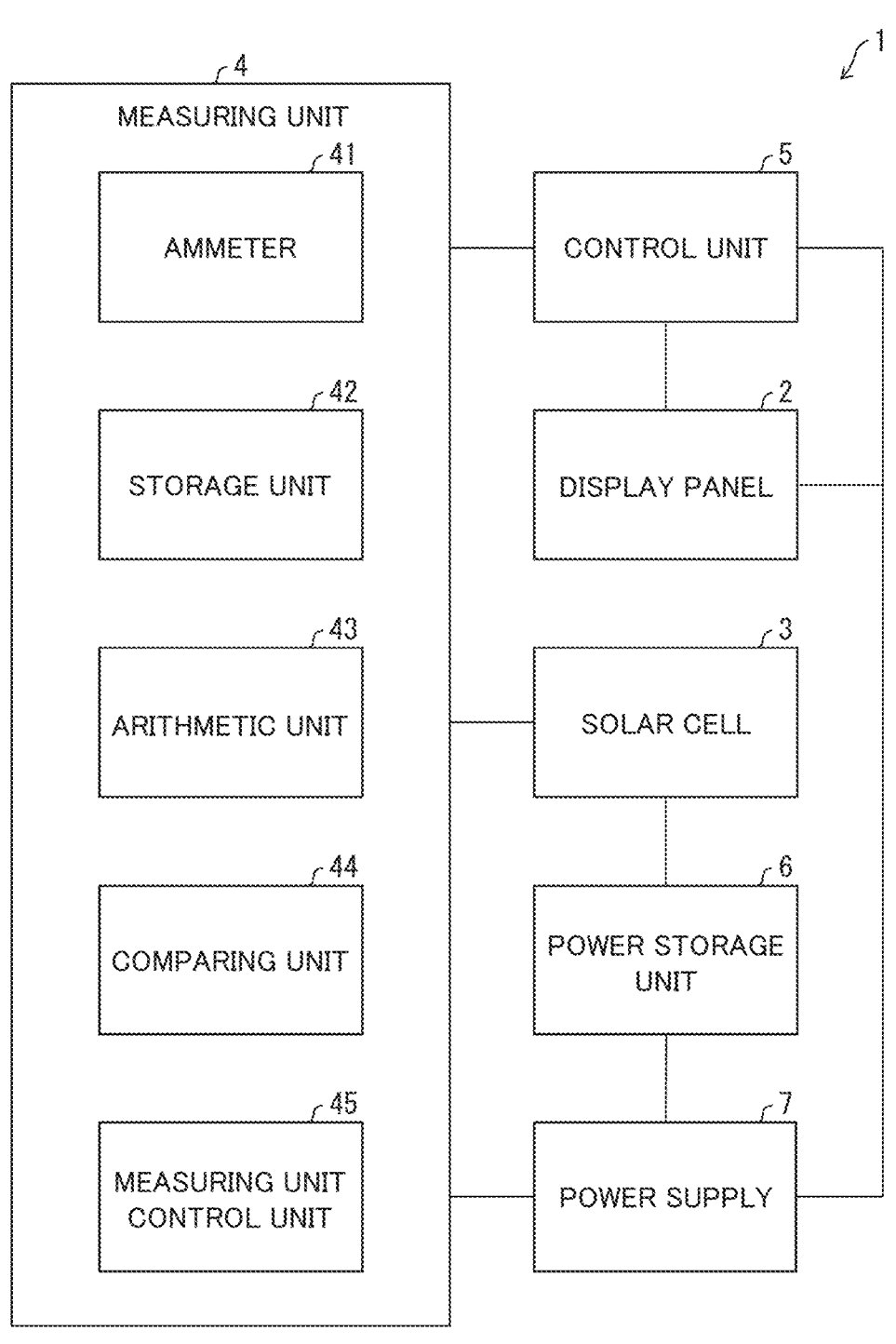
FIG. 1 illustrates a block diagram of a display device according to a first embodiment.

FIG. 1 illustrates a block diagram of a display device 1 according to this embodiment. The display device 1 includes: a display panel 2; a solar cell 3; a measuring unit 4; a control unit 5; a power storage unit 6; and a power supply 7.

The display panel 2 includes a plurality of light-emitting elements to be described later. Emission of light from each of the light-emitting elements is individually controlled so that the display panel 2 displays an image. A detailed structure of, and a display method for, the display panel 2 will be described later.

The solar cell 3 generates power from light coming out of the solar cell 3 and entering a photoactive layer to be described later. In particular, the solar cell 3 according to this embodiment receives not only light coming out of the display device 1 but also light emitted from the light-emitting elements of the display panel 2. In other words, the solar cell 3 according to this embodiment generates power from the light emitted from the light-emitting elements of the display panel 2. A detailed structure of, and a power generating method for, the solar cell 3 will be described later.

The measuring unit 4 measures output from the solar cell 3 by a method to be described later. The measuring unit 4 includes: an ammeter 41; a storage unit 42; an arithmetic unit 43; a comparing unit 44; and a measuring unit control unit 45. Details of the units in the measuring unit 4 will be described later.

The control unit 5 individually controls, with a control signal, emission of light from the plurality of light-emitting elements included in the display panel 2. Hence, the control unit 5 controls display of the display panel 2. For example, the control unit 5 individually applies a control signal to each of the electrodes of the plurality of light-emitting elements included in the display panel 2, in order to control display of the display panel 2. Note that, as will be described later, the control unit 5 corrects the control signals in accordance with a result of measurement carried out by the measuring unit 4. A method for correcting the control signals by the control unit 5 will be described later.

The power storage unit 6 may include a known storage cell such as a battery. For example, the power storage unit 6 stores electricity obtained by power generated by the solar cell 3. The power storage unit 6 may receive power from a device other than the solar cell 3, such as a power supply outside the display device 1.

The power supply 7 receives power from the power storage unit 6, and supplies the received power to each of the units in the display device 1. For example, the power supply 7 supplies power to the display panel 2, the measuring unit 4, and the control unit 5.

Between the units of the display device 1, signals and power may be exchanged either through a wire or wirelessly via a not-shown transmitter and a not-shown receiver. The exchange of the signals and power will be described later.

Display Panel

Figure 2:
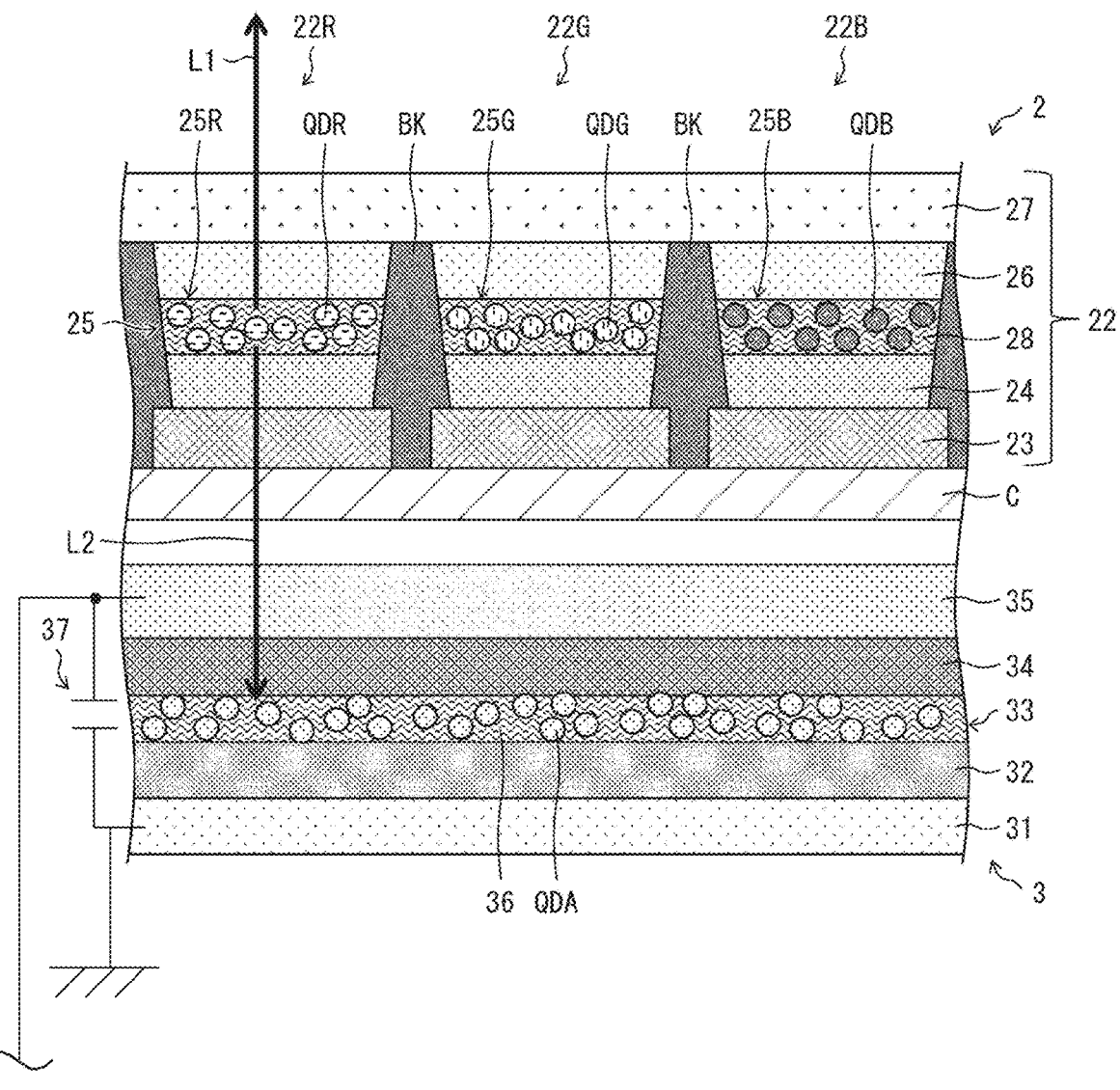
FIG. 2 illustrates schematic sectional side views of a display panel and a solar cell according to the first embodiment.

Described below with reference to FIG. 2 will be specific structures of the display panel 2 and the solar cell 3 according to this embodiment. FIG. 2 illustrates schematic side views of the display panel 2 and the solar cell 3 according to this embodiment.

The display device 1 includes a substrate C including a drive circuit for each of the subpixels. The display panel 2 includes a light-emitting-element layer 22 on the substrate C. The light-emitting-element layer 22 has, sequentially from toward the substrate C: a cathode 23; an electron transport layer 24; a light-emitting layer 25; a hole transport layer 26; and an anode 27.

Furthermore, the display device 1 has a bank BK on the substrate C. The bank BK partitions the layers of the light-emitting element layer 22 for each of the subpixels of the display panel 2. Hence, the cathode 23, the electron transport layer 24, the light-emitting layer 25, and the hole transport layer 26 of the light-emitting-element layer 22 are partitioned by the bank BK and formed for each of the subpixels of the display panel 2.

As will be described later, the light-emitting layer 25 is partitioned by the bank BK into: a red light-emitting layer 25R that emits a red light; a green light-emitting layer 25G that emits a green light; and a blue light-emitting layer 25B that emits a blue light. In particular, in this embodiment, the light-emitting layer 25 has, in a plan view of the substrate C, the red light-emitting layer 25R positioned to overlap with a red subpixel, the green light-emitting layer 25G positioned to overlap with a green subpixel, and the blue light-emitting layer 25B positioned to overlap with a blue subpixel.

Whereas, the cathode 23, the electron transport layer 24, and the hole transport layer 26 may have the same configurations in any of the subpixels. Furthermore, the anode 27 may be formed in common to the plurality of subpixels.

As can be seen, in the plan view of the substrate C, the red light-emitting element 22R including the cathode 23, the electron transport layer 24, the red light-emitting layer 25R, the hole transport layer 26, and the anode 27 is formed in a position overlapping with the red subpixel of the substrate C. Furthermore, in the plan view of the substrate C, the green light-emitting element 22G including the cathode 23, the electron transport layer 24, the green light-emitting layer 25G, the hole transport layer 26, and the anode 27 is formed in a position overlapping with the green subpixel of the substrate C. Moreover, in the plan view of the substrate C, the blue light-emitting element 22B including the cathode 23, the electron transport layer 24, the blue light-emitting layer 25B, the hole transport layer 26, and the anode 27 is formed in a position overlapping with the blue subpixel of the substrate C.

Hence, the display panel 2 includes the red light-emitting element 22R, the green light-emitting element 22G, and the blue light-emitting element 22B. By a method to be described later, the display panel 2 individually releases light out of the red light-emitting element 22R, the green light-emitting element 22G, and the blue light-emitting element 22B, in order to display an image.

In this embodiment, each of a plurality of the cathodes 23 is electrically connected to a corresponding one of the drive circuits of the substrate C. The display device 1 may cause the control unit 5 to individually drive the drive circuits, in order to control a voltage to be applied to each of the cathodes 23. For example, the control unit 5 may hold the anode 27 at a predetermined potential and apply a driving signal to each of the cathodes 23, in order to control light to be emitted from each of the light-emitting elements.

The cathode 23 and the anode 27 according to this embodiment are both transparent electrodes that transmit visible light. The transparent electrodes may be formed of, for example, ITO, IZO, $SnO_2$, or FTO.

The electron transport layer 24 transports electrons, which are injected from the cathode 23, to the light-emitting layer 25. The electron transport layer 24 may be made of a known organic or inorganic material capable of transporting the electrons and used for injection-electroluminescence light-emitting elements. The hole transport layer 26 transports holes, which are injected from the anode 27, to the light-emitting layer 25. The hole transport layer 26 may be made of an organic material or an inorganic material capable of transporting the holes and conventionally used for injection-electroluminescence light-emitting elements.

The red light-emitting layer 25R, the green light-emitting layer 25G, and the blue light-emitting layer 25B respectively contain, as light-emitting materials, a plurality of red quantum dots QDR, a plurality of green quantum dots QDG, and a plurality of blue quantum dots QDB. The light-emitting layer 25 may contain the quantum dots dispersed in an organic or inorganic transparent layer 28, or may contain the quantum dots simply in the form of layers stacked on top of another.

When each of the light-emitting elements is driven, the holes are injected from the anode 31 through the hole transport layer 32 into each of the quantum dots, and the electrons are injected from the cathode 35 through the electron transport layer 34 into each of the quantum dots.

Each of a red quantum dot QDR, a green quantum dot QDG, and a blue quantum dot QDB, which is referred to as a core-shell quantum dot, may have, for example, a core-shell structure including: a core; and a shell positioned at least partially around the core. Injected into the core of each quantum dot are electrons from the cathode 23 and holes from the anode 27. When the holes and the electrons recombine together, excitons are generated to emit light. The red quantum dots QDR, the green quantum dots QDG, and the blue quantum dots QDB emit a red light, a green light, and a blue light from the respective cores. The quantum dots contained in the light-emitting layer 25 may have any given particle diameter. For example, the quantum dots may have a maximum particle diameter of 100 nm or less.

Note that the light-emitting element layer 22 shall not be limited to the above example. The light-emitting-element layer 22 may have the anode 27, the hole transport layer 26, the light-emitting layer 25, the electron transport layer 24, and the cathode 23, all of which are sequentially provided from toward, and above, the substrate C. In this case, the bank BK may partition the anode 27, the hole transport layer 26, the light-emitting layer 25, and the electron transport layer 24 for each of the subpixels. The cathode 23 may be formed in common to the plurality of subpixels.

In this embodiment, the light from the light-emitting layer 25 includes: light L1 from the light-emitting layer 25 toward the anode 27, in other words, across from the substrate C; and light L2 from the light-emitting layer 25 toward the cathode, in other words, toward the substrate C. In this embodiment, the display panel 2 displays an image, using the light L1. In other words, the display panel 2 has a display surface provided across from the substrate C. Note that, in this embodiment, the substrate C includes a light-transparent member to at least partially transmit the light L2. Hence, the display panel 2 releases, also from toward the substrate C, light of the light-emitting elements outwards.

Solar Cell

In this embodiment, the solar cell 3 is formed across from the display surface of the display panel 2. In particular, in this embodiment, the solar cell 3 is formed across the substrate C from the display panel 2. Hence, the light L2 of each of the light-emitting elements of the display panel 2 at least partially passes through the substrate C and reaches the solar cell 3. In this embodiment, the display device 1 includes a single solar cell 3 in common to the plurality of subpixels of the substrate C in the plan view of the substrate C. Note that this embodiment shall not be limited to such a configuration. The display device 1 may include a plurality of the solar cells 3.

The solar cell 3 includes: an anode 31; a hole transport layer 32; a photoactive layer 33; an electron transport layer 34; and a cathode 35 in the stated order. The solar cell 3 may have either the anode 31 or the cathode 35 provided toward the substrate C. The anode 31, the hole transport layer 32, the electron transport layer 34, and the cathode 35 may be respectively the same in configuration as the anode 27, the hole transport layer 26, the electron transport layer 24, and the cathode 23 that the light-emitting-element layer 22 has. Note that the electron transport layer 34 and the cathode 35 contain a light-transparent material, and transmit the light L2 from each of the light-emitting elements of the display panel 2 and allow the light L2 to reach the photoactive layer 33. Furthermore, the anode 31 and the hole transport layer 32 may contain a light-transparent material, and transmit light out of the display device 1 and allow the light to reach the photoactive layer 33.

The photoactive layer 33 contains a plurality of quantum dots serving as a light-receiving material. The plurality of quantum dots can absorb the light L2 emitted from each of the light-emitting elements of the display panel 2. For example, the photoactive layer 33 contains a plurality of infrared quantum dots QDA dispersed in an inorganic or organic transparent layer 36 and absorbing infrared light and light having a wavelength shorter than infrared light. In other words, the photoactive layer 33 of the solar cell 3 is sensitive to light having a wavelength greater than, or equal to, a wavelength of visible light. The infrared quantum dots QDA absorb incoming light, and generate holes and electrons by photoelectric conversion. The holes are transported through the hole transport layer 32 to the anode 31, and the electrons are transported through the electron transport layer 34 to the cathode 35.

The anode 31 of the solar cell 3 may be grounded, and the solar cell 3 may have a capacitor 37 formed between the anode 31 and the cathode 35. Although not shown, the cathode 35 of the solar cell 3 may be connected to the ammeter 41 of the measuring unit 4 and to the power storage unit 6. Hence, the display device 1 may cause: the ammeter 41 of the measuring unit 4 to measure the amount of power generated by the solar cell 3; and the power storage unit 6 to store the power generated by the solar cell 3.

Measuring Unit and Control Unit

Returning to FIG. 1, each of the units of the measuring unit 4 and the control unit 5 will be described. The ammeter 41 of the measuring unit 4 measures magnitude of a current generated by the solar cell 3, in order to measure output of the solar cell 3. The measuring unit 4 may include, instead of the ammeter 41, a voltmeter to measure an electromotive force of power generated by the solar cell 3.

The storage unit 42, which is a nonvolatile storage unit, stores data transmitted from each of the units of the measuring unit 4, and transmits the stored data to each of the units of the measuring unit 4. For example, a current value measured by the ammeter 41 is stored in the storage unit 42.

The arithmetic unit 43 performs arithmetic computation on the data stored in the storage unit 42. In particular, the arithmetic unit 43 performs arithmetic computation on the output of the solar cell 3, in order to make correction to display of the display panel 2. An arithmetic result obtained by the arithmetic computation of the arithmetic unit 43 may be stored in the storage unit 42. Specific details of the arithmetic computation performed by the arithmetic unit 43 will be described later.

The comparing unit 44 compares the data stored in the storage unit 42 and the arithmetic results obtained by the arithmetic computation performed by the arithmetic unit 43. The comparing unit 44 may calculate a ratio of the data to be compared, and the ratio may be stored in the storage unit 42. Data calculated by the comparing unit 44 may be stored in the storage unit 42 as a result of the measurement performed by the measuring unit 4. Specific details of the comparison performed by the comparing unit 44 will be described later.

The measuring unit control unit 45 controls an operation of each of the units in the measuring unit 4; in particular, the ammeter 41, the storage unit 42, the arithmetic unit 43, and the comparing unit 44.

The control unit 5 generates control signals in accordance with information to be displayed on the display panel 2, and applies each of the control signals to a drive circuit of a corresponding one of the light-emitting elements of the display panel 2. Hence, the control unit 5 controls, through each of the drive circuits, emission of light from the corresponding light-emitting element of the display panel 2, and controls display of the display panel 2.

In this embodiment, the control unit 5 corrects a control signal to be applied to each of the light-emitting elements of the display panel 2, in order to correct display of the display panel 2. For example, by a method to be described later, the control unit 5 corrects the control signal in accordance with a result of measurement carried out by the measuring unit 4.

Method for Correcting White Balance

Figure 3:
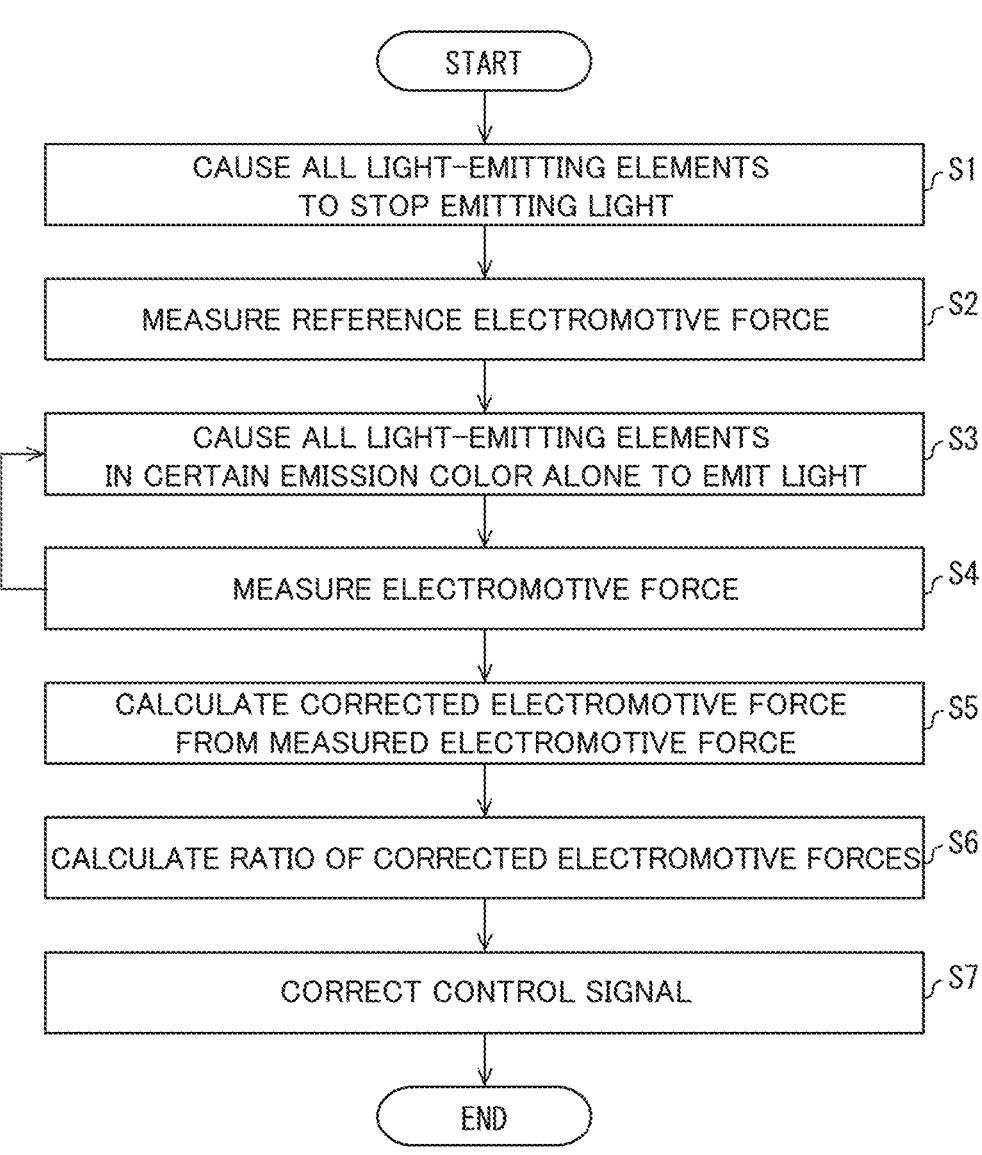
FIG. 3 shows a flowchart showing an example of a method for controlling the display device according to the first embodiment.

Described below will be an exemplary method for controlling the display device 1 according to this embodiment, with reference to FIG. 3. FIG. 3 shows a flowchart showing an example of a method for controlling the display device 1 according to this embodiment. The method for controlling the display device 1 shown in FIG. 3 includes a method for correcting white balance of the display panel 2 through correction of a control signal by the control unit 5.

The method for controlling the display device 1 shown in FIG. 3 may be executed when the display device 1 performs a normal operation continuously for a predetermined period. In other words, the control method may be executed intermittently during the normal operation of the display device 1. Furthermore, the control method may be executed when the display device 1 either turns ON or OFF. Moreover, the control method may be executed appropriately in accordance with a setting made by a user of the display device 1.

In the method for controlling the display device 1 shown in FIG. 3, first, the control unit 5 stops applying a control signal to each of the light-emitting elements of the display panel 2, in order to cause all the light-emitting elements included in the display panel 2 to stop emitting light (Step S1). As a result, the entire display panel 2 turns dark, and the light stops entering from each of the light-emitting elements of the display panel 2 into the solar cell 3.

Next, while each of the light-emitting elements of the display panel 2 stops emitting light, the measuring unit 4 measures an electromotive force generated in the solar cell 3, in order to measure a reference electromotive force (Step S2). The reference electromotive force corresponds to an electromotive force generated by light reaching the photoactive layer 33 of the solar cell 3, except for light from each light-emitting element of the display panel 2. The reference electromotive force may be stored in the storage unit 42.

Hereinafter, in the Description, when the measuring unit 4 measures the electromotive force generated in the solar cell 3, the measurement may be executed through measurement of a current by the ammeter 41.

Next, the control unit 5 transmits a control signal only to a drive circuit corresponding to a light-emitting element in a specific emission color, in order to cause all the light-emitting elements in the emission color alone to emit light (Step S3). For example, the control unit 5 causes all the red light-emitting elements 22R alone to emit light so that the red light-emitting elements 22R serve as first light-emitting elements that emit light in a first color.

Next, the measuring unit 4 measures the electromotive force generated in the solar cell 3 (Step S4). The electromotive force corresponds to a first electromotive force including the reference electromotive force described above and additionally including an electromotive force generated when light from all the red light-emitting elements 22R, which serve as the first light-emitting elements of the display panel 2, reaches the photoactive layer 33 of the solar cell 3. The first electromotive force may be stored in the storage unit 42.

After that, Step S3 and Step S4 are repeatedly executed while the control unit 5 changes the emission colors of light to be emitted from the light-emitting elements. For example, following the measurement of the first electromotive force, the control unit 5 causes all the green light-emitting elements 22G alone to emit light so that the green light-emitting elements 22G serve as second light-emitting elements that emit light in a second color. Next, the measuring unit 4 measures the electromotive force generated in the solar cell 3. The electromotive force corresponds to a second electromotive force including the reference electromotive force described above and additionally including an electromotive force generated when light from all the green light-emitting elements 22G, which serve as the second light-emitting elements of the display panel 2, reaches the photoactive layer 33 of the solar cell 3.

Note that, while all the blue light-emitting elements 22B alone emit light, the electromotive force generated in the solar cell 3 may be measured by the same method. Step S3 and Step S4 may be repeatedly executed until all the light-emitting elements emit light after Step S1. The electromotive forces measured at Step S4 may be sequentially stored in the storage unit 42.

After the light-emitting elements corresponding to all the emission colors emit light and the electromotive forces are measured, the arithmetic unit 43 of the measuring unit 4 calculates, for example, a corrected electromotive force obtained by subtracting the reference electromotive force from each of the measured electromotive forces, using the data stored in the storage unit 42 (Step S5). For example, the arithmetic unit 43 calculates: a first corrected electromotive force obtained by subtracting the corrected electromotive force from the first electromotive force; and a second corrected electromotive force obtained by subtracting the corrected electromotive force from the second electromotive force.

Next, the comparing unit 44 compares the corrected electromotive forces, and calculates a ratio of the corrected electromotive forces (Step S6). For example, the comparing unit 44 calculates a ratio of the first corrected electromotive force to the second corrected electromotive force.

The first corrected electromotive force and the second corrected electromotive force respectively correspond to: an electromotive force generated in the solar cell 3 only by light from all the first light-emitting elements of the display panel 2; and an electromotive force generated in the solar cell 3 only by light from all the second light-emitting elements of the display panel 2. Suppose, for example, an environment around the display device 1 is constant; in other words, the reference electromotive force is constant. In this case, the first corrected electromotive force is approximately proportional to a sum of the light from all the first light-emitting elements of the display panel 2, and the second corrected electromotive force is approximately proportional to a sum of the light from all the second light-emitting elements of the display panel 2. Furthermore, the first corrected electromotive force also depends on sensitivity of the photoactive layer 33 of the solar cell 3 with respect to the light of the first light-emitting elements. The same applies to the second corrected electromotive force. Note that the sensitivity of the photoactive layer 33 with respect to incident light may change with time. Hence, the ratio of the first corrected electromotive force to the second corrected electromotive force corresponds to a ratio of a value, which is obtained by multiplying a sum of emission intensities of the first light-emitting elements by the sensitivity of the photoactive layer 33 with respect to the light of each of the light-emitting elements and by variability of the sensitivity with time to a value, which is obtained by multiplying a sum of emission intensities of the second light-emitting elements by the sensitivity of the photoactive layer 33 with respect to the light of each of the light-emitting elements and by variability of the sensitivity with time.

Next, in accordance with the measurement by the measuring unit 4, the control unit 5 corrects a control signal to be applied to a drive circuit of a corresponding one of the light-emitting elements of the display panel 2 (Step S7). For example, the control unit 5 corrects the control signal so that the ratio of the corrected electromotive forces calculated at Step S6 is close to the ratio of those at the time when the display device 1 is shipped.

For example, the storage unit 42 stores the ratio of the first corrected electromotive force to the second corrected electromotive force measured in a state where the luminance of each light-emitting element is previously adjusted to a desired white balance at the time of shipment. Furthermore, the control unit 5 corrects intensity of a control signal to be applied to a light-emitting element in a corresponding emission color so that a ratio of the first corrected electromotive force to the second corrected electromotive force at present time is close to a ratio of the first corrected electromotive force to the second corrected electromotive force at the time of shipment.

Exemplary Correction of White Balance

Figure 4:
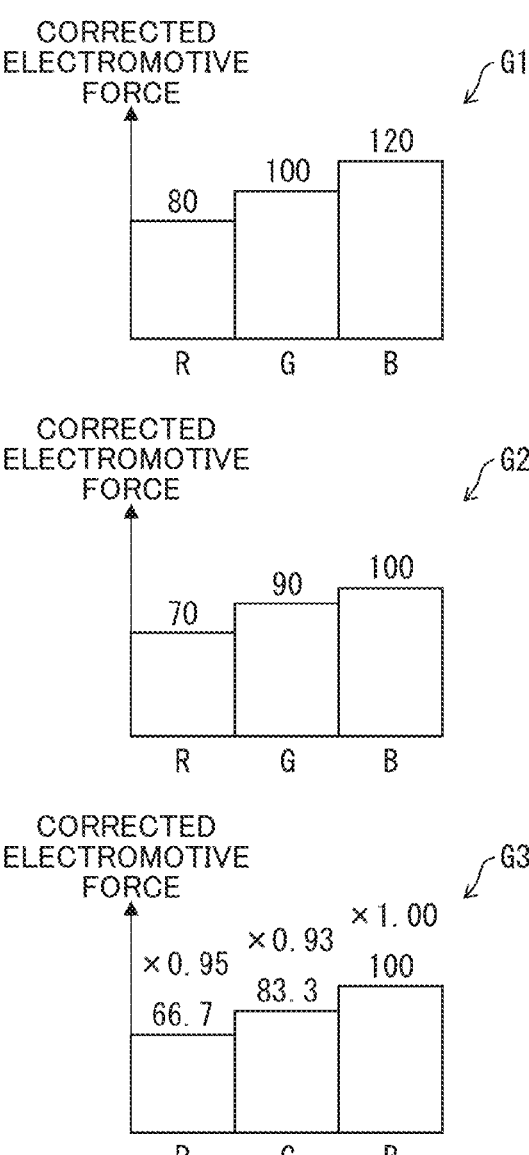
FIG. 4 illustrates graphs showing an exemplary relationship between a corrected electromotive force and a color of light of the light-emitting elements of the display panel according to the first embodiment.

At Step S7 of this embodiment, the control unit 5 corrects the white balance of the display panel 2 through the correction of the control signal. The correction of the white balance of the display panel 2 by the control unit 5 will be described in more detail with reference to FIG. 4. FIG. 4 illustrates graphs showing an exemplary relationship between a corrected electromotive force and a color of light emitted from each of the light-emitting elements according to this embodiment.

A graph G1 illustrated in FIG. 4 is a graph showing a corrected electromotive force measured, for each of the emission colors of the light-emitting elements, when all the red light-emitting elements 22R alone, all the green light-emitting elements 22G alone, and all the blue-light emitting elements 22B alone are caused to emit light at the time when the display device 1 is shipped. A graph G2 is a graph showing the corrected electromotive force measured, for each of the emission colors of the light-emitting elements, after the display device 1 has been used for a predetermined period of time. A graph G3 is a graph showing the corrected electromotive forces measured, for each of the emission colors of the light-emitting elements, after the control unit 5 has corrected the control signal in accordance with measured values of the corrected electromotive forces shown in the graph G2. Note that, in FIG. 4, the corrected electromotive force observed when the green light-emitting elements 22G are caused to emit light at the time of shipment is set to 100, and a ratio of each corrected electromotive force to the corrected electromotive force set to 100 is shown in the graphs.

For example, as illustrated in the graph G1, when all the red light-emitting elements 22R alone, all the green light-emitting elements 22G alone, and all the blue light-emitting elements 22B alone emit light at the time when the display device 1 is shipped, the corrected electromotive forces are 80, 100, and 120, respectively.

As illustrated in the graph G2, when the display device is used for a predetermined period of time, the corrected electromotive forces could decrease to 70, 90, and 100. The decrease shows that time-related deterioration of the light-emitting elements of the display panel 2 reduces intensity of light emitted from the light-emitting elements and reaching the photoactive layer 33 of the solar cell 3. As can be seen, the display device 1 can monitor the time-related deterioration of the light-emitting elements of the display panel 2 through the measurement of the output from the solar cell 3.

Here, the ratio of the corrected electromotive forces obtained for each of the emission colors of the light-emitting elements is a ratio of emission intensities of the light-emitting elements for each of the emission colors. In other words, the ratio of the corrected electromotive forces corresponds to the white balance of the display panel 2. In a case of the above example, at the time when the display device 1 is shipped, a ratio of the emission intensities of the red light-emitting elements 22R, the green light-emitting elements 22G, and the blue light-emitting elements 22B is 80:100:120. Furthermore, if the display device 1 is used for a predetermined period of time, the above ratio changes to 70:90:100.

Typically, the progress in the time-related deterioration of light-emitting elements varies depending on a color of light emitted from the light-emitting elements. For example, a light-emitting element emitting a blue light is likely to deteriorate with time faster than a light-emitting element emitting light having a longer wavelength such as a red light or a green light. Hence, the display device 1 might suffer variation in white balance between the moment of shipment and the moment after the use for a predetermined period of time. If the white balance of the display panel 2 varies, in other words, if a difference occurs in the luminance between the light-emitting elements depending on an emission color, the color of the image to be displayed changes, and, as a result, the display quality of the display panel 2 might deteriorate.

In this embodiment, the control unit 5 corrects the intensity of a control signal for driving each of the light-emitting elements of the display panel 2, in order to correct the white balance of the display panel 2. For example, with reference to a control signal of a light-emitting element having the most deteriorated emission color among the emission colors of the light-emitting elements of the display panel 2, the control unit 5 reduces intensity of a control signal of a light-emitting element having another emission color, in order to perform the correction.

In the above example in which the variations in white balance occur, the comparison between the graph G1 and the graph G2 shows that the blue light-emitting elements 22B deteriorate most. Hence, with reference to the intensity of a control signal to be applied to the drive circuit of each blue light-emitting element 22B, the control unit 5 reduces the intensity of a control signal to be applied to a drive circuit of each red light-emitting element 22R and each green light-emitting element 22G.

For example, as illustrated in the graph G3, the control unit 5 sets the intensities of the control signals to 0.95× and 0.93×. The control signal having an intensity of 0.95× is applied to the drive circuit of the red light-emitting element 22R, and the control signal having an intensity of 0.93× is applied to the drive circuit of the green light-emitting element 22G. An intensity of 1.00× is set to the control signal to be applied to the drive circuit of the blue light-emitting element 22B, which is used as a reference for the correction. No correction is made to the intensity. Hence, the ratio of corrected electromotive forces after correction; that is, the ratio of the emission intensities of the red light-emitting elements 22R, the green light-emitting elements 22G, and the blue light-emitting elements 22B is 66.7:83.3:

100. Note that the sensitivity of the solar cell 3 with respect to the light of each of the light-emitting elements and the variability of the sensitivity with time are cancelled by comparing with the ratio measured at the time of shipment. As can be seen, the control unit 5 can correct the control signal, so that the white balance of the display panel 2 is close to the white balance observed at the time of shipment. Hence, the control unit 5 only needs to correct a control signal corresponding to at least one light-emitting element. As the control signal corresponding to the blue light-emitting element 22B in the above example, a control signal that is not corrected may be found.

At Step S7, the control unit 5 corrects a control signal. After that, in accordance with the corrected control signal, the control unit 5 controls display of the display panel 2. Thanks to the method for controlling the display device 1 according to this embodiment, the display device 1 allows the control unit 5 to more appropriately execute display control of the display panel 2, thereby successfully improving display quality of the display panel 2.

Advantageous Effects of First Embodiment

The display device 1 according to this embodiment includes: the solar cell 3 that receives light from each of the light-emitting elements of the display panel 2; and the measuring unit 4 that measures the output from the solar cell 3. Hence, the display device 1 can measure time-related deterioration of the light-emitting elements of the display panel 2 through the measurement of the output from the solar cell 3. In particular, the photoactive layer 33 of the solar cell 3 contains the infrared quantum dots QDA sensitive to light having a wavelength greater than, or equal to, a wavelength of visible light. Hence, the display device 1 can reduce time-related variations in the sensitivity, of the photoactive layer 33 of the solar cell 3, with respect to the light from each of the light-emitting elements, and can more efficiently measure the time-related deterioration of each of the light-emitting elements of the display panel 2, using the solar cell 3.

Furthermore, in accordance with a result of the measurement by the measuring unit 4 of the output from the solar cell 3, the control unit 5 corrects a control signal used for driving each of the light-emitting elements of the display panel 2. Hence, even if the light-emitting elements suffer time-related deterioration, the display device 1 can reduce deterioration in display quality of the display panel 2.

In this embodiment, the display device 1 can correct emission intensity between light-emitting elements each having a different emission color, including the first light-emitting element and the second light-emitting element. As can be seen, the display device 1 can execute correction of colors including the white balance of the display panel 2. Furthermore, the display device 1 performs the above correction in accordance with a corrected electromotive force of the output from the solar cell 3. The corrected electromotive force is obtained by subtracting the reference electromotive force from a measured electromotive force. Thanks to such a feature, the display device 1 can perform appropriate correction regardless of the external environment including ambient brightness.

In this embodiment, the control unit 5 corrects intensity of a control signal to be applied to a light-emitting element in a corresponding emission color so that a ratio of the first corrected electromotive force to the second corrected electromotive force at present time is close to a ratio of the first corrected electromotive force to the second corrected electromotive force at the time of shipment. Hence, the control unit 5 corrects the control signal using the ratio of the corrected electromotive forces as described above. Thus, the control unit 5 reduces influence of a decrease in the sensitivity of the photoactive layer 33 associated with the deterioration of the photoactive layer 33 of the solar cell 3. Furthermore, as described above, the control unit 5 reduces influence on correction of a control signal even if the sensitivity of the photoactive layer 33 is different between the light of the first light-emitting element and the light of the second light-emitting element.

In this embodiment, the display device 1 includes a single solar cell 3. Hence, to the display device 1, a difference is less likely to occur in progress of the deterioration of the solar cell 3 between the positions of the solar cells 3 in a plan view of the substrate C. Thus, the display device 1 allows the measuring unit 4 to appropriately measure the electromotive forces and the control unit 5 to appropriately correct control signals.

In this embodiment, the light-emitting layer 25 of each of the light-emitting elements of the display panel 2 includes quantum dots serving as a light-emitting material. Hence, the display device 1 reduces a half-value breadth of a wavelength spectrum of the light from each of the light-emitting elements of the display panel 2, and further improves the display quality of the display panel 2. Furthermore, the photoactive layer 33 of the solar cell 3 includes quantum dots serving as a light-receiving material. Hence, the display device 1 allows the photoactive layer 33 of the solar cell 3 to be more sensitive to light, thereby making it possible to efficiently converting light incident on the solar cell 3 into power.

The display device 1 according to this embodiment includes: quantum dots serving as a light-emitting material for the light-emitting layer 25 of the display panel 2; and quantum dots serving as a light-receiving material for the photoactive layer 33 of the solar cell 3. Hence, in producing the display device 1, either the same production apparatus or the same production method is used to produce the light-emitting layer 25 and the photoactive layer 33. Such a feature can simplify steps of producing the display device 1. In particular, the layers from the cathode 23 to the anode 27 of the display panel 2 and the layers from the cathode 35 to the anode 31 of the solar cell 3 may be formed with the same production apparatus or by the same production method. In this case, the display panel 2 and the solar cell 3 can be produced at, for example, the same factory and the same production step. Such a feature makes it possible to readily produce the display device 1 integrally including the display panel 2 and the solar cell 3.

The display device 1 includes the solar cell 3 provided across from the display surface of the display panel 2. Thanks to such a feature, the display device 1 can keep the solar cell 3 from acting as an interference with an image displayed on the display panel 2. Furthermore, the display device 1 includes the solar cell 3 across the substrate C from the display panel 2, so that the light from each of the light-emitting elements of the display panel 2 is at least partially passes through the substrate C, and reaches the solar cell 3. Thanks to such a feature, the display device 1 can keep the solar cell 3 from acting as an interference with an image displayed on the display panel 2, and allows the solar cell 3 to receive the light from each of the light-emitting elements of the display panel 2.

Moreover, in this embodiment, the solar cell 3 is not positioned between the substrate C having the drive circuits and the display panel 2 having the light-emitting elements.

Hence, in the display device 1, the drive circuits of the substrate C and the cathodes 23 of the display panel 2 are readily connected together. Such a feature can simplify the structure of the display panel 2.

In this embodiment, for example, the power generated by the solar cell 3 is stored in the power storage unit 6, and the power stored in the power storage unit 6 is used to operate each of the units of the display device 1. In other words, the display device 1 operates at least partially on the power generated by the solar cell 3. Hence, the display device 1 can reduce power consumption while monitoring, using the solar cell 3, time-related deterioration of each of the light-emitting elements of the display panel 2.

Second Embodiment

Correction of Unevenness in Luminance

Another embodiment of the present disclosure will be described below. Note that, for convenience in description, like reference signs designate members having identical functions between this embodiment and the above embodiment. These members will not be elaborated upon repeatedly.

The display device 1 according to this embodiment may be the same in configuration as the display device 1 according to the previous embodiment. A method for controlling the display device 1 according to this embodiment is implemented by partially modifying the method for controlling the display device 1 according to the previous embodiment.

Figure 5:
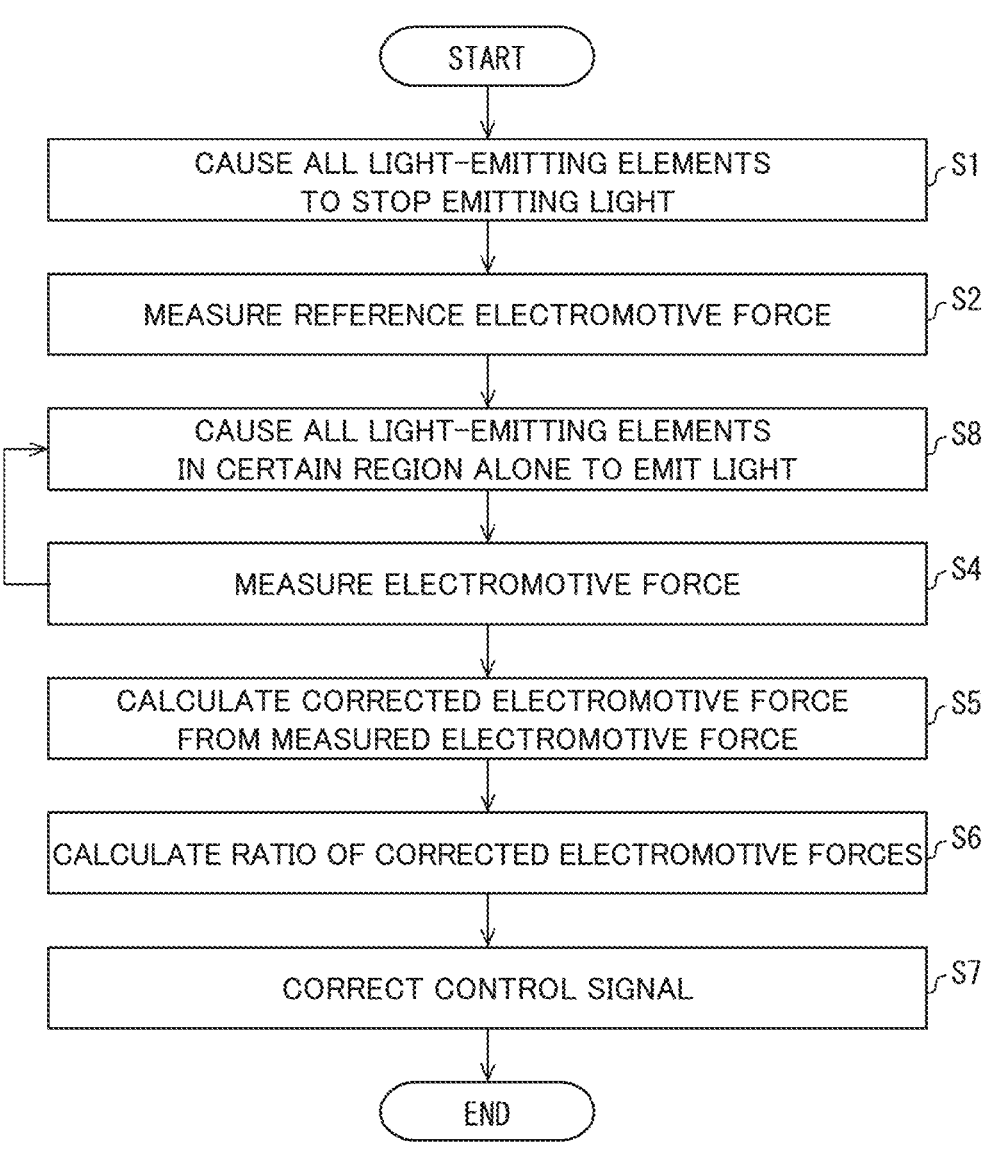
FIG. 5 shows a flowchart showing an example of a method for controlling a display device according to a second embodiment.

Described below will be an exemplary method for controlling the display device 1 according to this embodiment, with reference to FIG. 5. FIG. 5 shows a flowchart showing an example of a method for controlling the display device 1 according to this embodiment. The method for controlling the display device 1 shown in FIG. 5 includes a method for correcting unevenness in luminance of the display panel 2 through correction of a control signal by the control unit 5.

In the method for controlling the display device 1 shown in FIG. 5, first, the same steps as Step S1 and Step S2 according to the previous embodiment are sequentially carried out, and the measuring unit 4 measures a reference electromotive force.

Next, in the method for controlling the display device 1 according to this embodiment, among the light-emitting elements included in the display panel 2, a light-emitting element alone, positioned in a certain region in a plan view of the display panel 2, is caused to emit light (Step S8). For example, the display panel 2 includes a first region in a portion of a display region, and the control unit 5 applies a control signal to a drive circuit corresponding to one of a plurality of first region light-emitting elements formed in the first region to cause the first region light-emitting elements alone to emit light.

Here, the measuring unit 4 may store in the storage unit 42 information on the region where the light-emitting elements, which are caused by the control unit 5 to emit light at Step S8, are positioned. For example, the measuring unit 4 may identify, from a control signal generated by the control unit 5, information on the position of the light-emitting elements caused by the control unit 5 to emit light at Step S8, and store the information in the storage unit 42.

Next, using the same method carried out at Step S4 according to the previous embodiment, the measuring unit 4 measures an electromotive force generated in the solar cell 3. The electromotive force corresponds to a third electromotive force including the reference electromotive force described above and additionally including an electromotive force generated when light from all the first region light-emitting elements of the display panel 2 reaches the photoactive layer 33 of the solar cell 3. The third electromotive force may be stored in the storage unit 42.

After that, Step S8 and Step S4 are repeatedly executed, changing regions on the display panel 2. Positioned in the regions are the light-emitting elements caused by the control unit 5 to emit light. For example, following the measurement of the third electromotive force, the control unit 5 causes all second region light-emitting elements alone to emit light. The second region light-emitting elements are positioned in a second region that is a region different from the first region of the display region of the display panel 2. Next, the measuring unit 4 measures the electromotive force generated in the solar cell 3. The electromotive force corresponds to a fourth electromotive force including the reference electromotive force described above and additionally including an electromotive force generated when light from all the second region light-emitting elements of the display panel 2 reaches the photoactive layer 33 of the solar cell 3.

Step S8 and Step S4 may be repeatedly executed until all the light-emitting elements emit light after Step S1. The electromotive forces measured at Step S4 may be sequentially stored in the storage unit 42.

After all the light-emitting elements positioned in the region on the display panel 2 emit light and the electromotive forces are measured, the arithmetic unit 43 of the measuring unit 4 calculates a corrected electromotive force obtained by subtracting the reference electromotive force from each of the measured electromotive forces, using the same method performed at Step S5 according to the previous embodiment. For example, the arithmetic unit 43 calculates: a third corrected electromotive force obtained by subtracting the corrected electromotive force from the third electromotive force; and a fourth corrected electromotive force obtained by subtracting the corrected electromotive force from a fourth electromotive force.

Next, the comparing unit 44 compares the corrected electromotive forces and calculates a ratio of the corrected electromotive forces, using the same method performed at Step S6 according to the previous embodiment. For example, the comparing unit 44 calculates a ratio of the third corrected electromotive force to the fourth corrected electromotive force. Because of the same reasons described in the previous embodiment, the ratio of the third corrected electromotive force to the fourth corrected electromotive force approximately corresponds to a ratio of a sum of emission intensities of the first region light-emitting elements to a sum of emission intensities of the second region light-emitting elements. Note that, in practice, the sensitivity of the photoactive layer 33 might vary from region to region in a plan view of the solar cell 3. Hence, the ratio of the third corrected electromotive force to the fourth corrected electromotive force might not completely match the ratio of the sum of the emission intensities of the first region light-emitting elements to the sum of the emission intensities of the second region light-emitting elements.

Next, in accordance with the measurement by the measuring unit 4, the control unit 5 corrects, in the same manner at Step S7 according to the previous embodiment, a control signal to be applied to a drive circuit of a corresponding one of the light-emitting elements of the display panel 2. For example, the control unit 5 corrects the control signal so that the ratio of the corrected electromotive forces calculated at Step S6 is close to the ratio of those at the time when the display device 1 is shipped.

For example, the storage unit 42 stores the ratio of the third corrected electromotive force to the fourth corrected electromotive force measured in a state where the luminance of each light-emitting element is corrected so that luminance of the regions in the display panel 2 in the plan view is uniform at the time of shipment. Furthermore, the control unit 5 corrects intensity of a control signal to be applied to a light-emitting element positioned in each region so that a ratio of the third corrected electromotive force to the fourth corrected electromotive force at present time is close to a ratio of the third corrected electromotive force to the fourth corrected electromotive force at the time of shipment.

Exemplary Correction of Unevenness in Luminance

At Step S7 of this embodiment, the control unit 5 corrects unevenness in luminance of the display panel 2 through the correction of the control signal. The correction of the unevenness in luminance of the display panel 2 by the control unit 5 will be described in more detail with reference to FIG. 6. FIG. 6 illustrates a schematic view of the display panel 2 according to this embodiment, showing an exemplary relationship between a corrected electromotive force and a region in which each light-emitting element is positioned.

Each of a schematic view 2A, a schematic view 2B, and a schematic view 2C of the display panel 2 illustrated in FIG. 6 shows a display region included in the display panel 2 and divided into a plurality of regions 2R in a plan view. Furthermore, the schematic views show, for each of the regions 2R by any given unit, a corrected electromotive force measured at the time of shipment, after the use for a predetermined period of time, and after the correction of the control signal by the control unit 5. In measuring the corrected electromotive force, the light-emitting elements positioned in the regions 2R alone are caused to emit light. Note that the schematic view 2C also shows a correction magnification of a control signal to be applied to the drive circuit corresponding to the light-emitting element in each region 2R. As described above, the sensitivity of the photoactive layer 33 might vary from region to region in the plan view of the solar cell 3. Hence, the schematic view 2A shows that, even though the luminance of the light-emitting elements is corrected so that luminance of the regions in the display panel 2 in the plan view is uniform at the time of shipment, the corrected electromotive forces measured for the respective regions 2R could vary.

As illustrated in the schematic view 2A and the schematic view 2B, the ratio of the corrected electromotive forces corresponding to the respective regions 2R could vary. Typically, the progress in time-related deterioration of the light-emitting elements might vary, depending on where on the display region of the display panel 2 the light-emitting elements are formed. Hence, the display device 1 might suffer unevenness in luminance between the moment of shipment and the moment after the use for a predetermined period of time.

In this embodiment, the control unit 5 corrects the intensity of a control signal for driving each of the light-emitting elements of the display panel 2, in order to correct the unevenness in luminance of the display panel 2. For example, as illustrated in the schematic view 2B, the measuring unit 4 identifies a region 2RM having a greatest rate of decrease in corrected electromotive force among the regions 2R of the display panel 2. Furthermore, with reference to a control signal of a light-emitting element positioned in the identified region 2RM, the control unit 5 reduces intensity of a control signal of a light-emitting element positioned in another region 2R, in order to perform the correction.

For example, the control unit 5 corrects intensity of a control signal to be applied to a drive circuit corresponding the light-emitting element in each region, in accordance with magnifications seen in the schematic view 2C. In particular, as shown in the schematic diagram 2C, a correction magnification of 1.00× is set for the region 2RM used as the reference of the correction. No correction is made to a control signal of the light-emitting element in the region 2RM. Correction magnifications of less than 1.00× are set for regions other than the region 2RM. In accordance with the correction magnifications, correction is made to the intensity of a control signal of the light-emitting element in each of the regions. As can be seen, the control unit 5 can correct the control signal, so that a ratio of a sum of emission intensities of the light-emitting elements in the respective regions 2R of the display panel 2 is close to the ratio at the time of shipment.

At Step S7, the control unit 5 corrects a control signal. After that, in accordance with the corrected control signal, the control unit 5 controls display of the display panel 2. Thanks to the method for controlling the display device 1 according to this embodiment, the display device 1 allows the control unit 5 to more appropriately execute display control of the display panel 2, thereby successfully improving display quality of the display panel 2.

In addition, the display device 1 according to this embodiment can measure time-related deterioration of each of the light-emitting elements of the display device 2, through measurement of the output from the solar cell 3. Furthermore, in this embodiment, the display device 1 can correct emission intensity between light-emitting elements each positioned in a different region, including the first region light-emitting element and the second region light-emitting element. Thanks to such a feature, the display device 1 can correct unevenness in luminance of the display panel 2. Furthermore, according to the correction processing of this embodiment, the control unit 5 corrects intensity of a control signal to be applied to a light-emitting element positioned in each region so that a ratio of the third corrected electromotive force to the fourth corrected electromotive force at present time is close to a ratio of the third corrected electromotive force to the fourth corrected electromotive force at the time of shipment. Hence, the control unit 5 corrects the control signal using the ratio of the corrected electromotive forces. Thus, the control unit 5 reduces influence of a decrease in the electromotive force of the photoactive layer 33 associated with the deterioration of the solar cell 3. Furthermore, as described above, the control unit 5 reduces influence on correction of a control signal even if the sensitivity of the photoactive layer 33 varies between the regions of the solar cell 3 in the plan view.

Third Embodiment

Simultaneous Correction of White Balance and
Unevenness in Luminance

The display device 1 according to this embodiment may be the same in configuration as the display device 1 according to any of the previous embodiments. A method for controlling the display device 1 according to this embodiment is implemented by partially modifying the method for controlling the display device 1 according to any of the previous embodiments.

Figure 7:
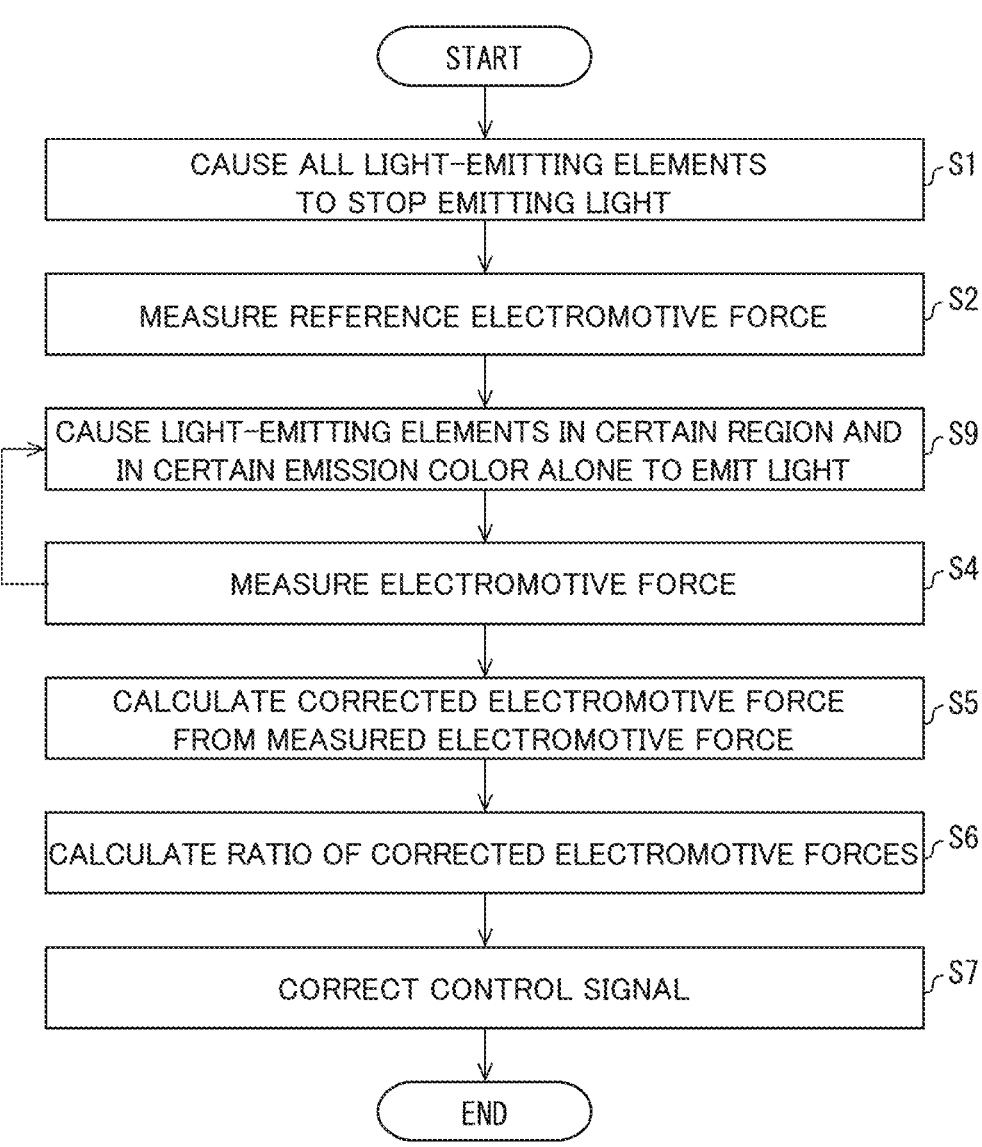
FIG. 7 shows a flowchart showing an example of a method for controlling a display device according to a third embodiment.

Described below will be an exemplary method for controlling the display device 1 according to this embodiment, with reference to FIG. 7. FIG. 7 shows a flowchart showing an example of a method for controlling the display device 1 according to this embodiment. The method for controlling the display device 1 shown in FIG. 7 includes a method for simultaneously correcting white balance and unevenness in luminance of the display panel 2 through correction of a control signal by the control unit 5.

In the method for controlling the display device 1 shown in FIG. 7, first, the same steps as Step S1 and Step S2 according to the above embodiments are sequentially carried out, and the measuring unit 4 measures a reference electromotive force. Next, in the method for controlling the display device 1 according to this embodiment, among the light-emitting elements included in the display panel 2, a light-emitting element alone, positioned in a certain region in a plan view of the display panel 2 and having a certain emission color, is caused to emit light (Step S9).

For example, the display panel 2 according to this embodiment includes the red light-emitting elements 22R and the green light-emitting elements 22G provided in the first region and serving as first region light-emitting elements. The red light-emitting elements 22R are fifth light-emitting elements that emit light in the first color. The green light-emitting elements 22G are sixth light-emitting elements that emit light in the second color different from the first color. Likewise, the display panel 2 according to this embodiment includes the red light-emitting elements 22R and the green light-emitting elements 22G provided in the second region and serving as the second region light-emitting elements. The red light-emitting elements 22R are seventh light-emitting elements that emit light in the first color. The green light-emitting elements 22G are eighth light-emitting elements that emit light in the second color. At Step S9, the control unit 5 causes, for example, the fifth light-emitting elements alone to emit light among the above light-emitting elements.

Next, using the same method carried out at Step S4 according to the previous embodiments, the measuring unit 4 measures an electromotive force generated in the solar cell 3. The electromotive force corresponds to a fifth electromotive force including the reference electromotive force described above and additionally including an electromotive force generated when light from the fifth light-emitting elements among the first region light-emitting elements of the display panel 2 reaches the photoactive layer 33 of the solar cell 3. The fifth electromotive force may be stored in the storage unit 42.

After that, Step S9 and Step S4 are repeatedly executed, changing colors of light or regions on the display panel 2. Positioned in the regions are the light-emitting elements caused by the control unit 5 to emit the light. For example, in this embodiment, following the measurement of the fifth electromotive force, the sixth light-emitting elements, the seventh light-emitting elements, and the eighth light-emitting elements are caused to emit light, and, respectively, a sixth electromotive force, a seventh electromotive force, and an eighth electromotive force are sequentially measured.

Step S9 and Step S4 may be repeatedly executed until all the light-emitting elements emit light after Step S1. The electromotive forces measured at Step S4 may be sequentially stored in the storage unit 42.

After all the light-emitting elements emit light and the electromotive forces are measured, the arithmetic unit 43 of the measuring unit 4 calculates a corrected electromotive force obtained by subtracting the reference electromotive force from each of the measured electromotive forces, using the same method performed at Step S5 according to the previous embodiment. For example, the arithmetic unit 43 calculates a fifth corrected electromotive force, a sixth corrected electromotive force, a seventh corrected electromotive force, and an eighth corrected electromotive force, each obtained by subtracting the corrected electromotive force from the respective electromotive forces.

Next, the comparing unit 44 compares the corrected electromotive forces and calculates a ratio of the corrected electromotive forces, using the same method performed at Step S6 according to the previous embodiments. For example, the comparing unit 44 calculates a ratio of the fifth corrected electromotive force to the sixth corrected electromotive force to the seventh corrected electromotive force to the eighth corrected electromotive force. Because of the same reasons described in the previous embodiments, the ratio approximately corresponds to a ratio of a sum of emission intensities of the fifth light-emitting elements, the sixth light-emitting elements, the seventh light-emitting elements, and the eighth light-emitting elements.

Next, in accordance with the measurement by the measuring unit 4, the control unit 5 corrects, in the same manner at Step S7 according to the previous embodiments, a control signal to be applied to a drive circuit of a corresponding one of the light-emitting elements of the display panel 2. For example, the control unit 5 corrects the control signal so that the ratio of the corrected electromotive forces calculated at Step S6 is close to the ratio of those at the time when the display device 1 is shipped.

For example, the storage unit 42 previously stores the ratio of the fifth corrected electromotive force to the sixth corrected electromotive force to the seventh corrected electromotive force to the eighth corrected electromotive force, the ratio being previously measured at the time of shipment. Furthermore, the control unit 5 corrects intensity of a control signal to be applied to a light-emitting element positioned in each region so that a ratio of the fifth corrected electromotive force to the sixth corrected electromotive force to the seventh corrected electromotive force to the eighth corrected electromotive force at present time is close to the ratio of those at the time of shipment.

Here, the control unit 5 corrects emission intensities between light-emitting elements that emit light in different colors, using the same correction method described in the first embodiment. Furthermore, the control unit 5 corrects emission intensities between light-emitting elements positioned in different regions of the display panel 2, using the same correction method described in the previous embodiments.

At Step S7, the control unit 5 corrects a control signal. After that, in accordance with the corrected control signal, the control unit 5 controls display of the display panel 2. Hence, the display device 1 according to this embodiment can correct the emission intensities between the regions of the display panel 2, and simultaneously correct the white balance within the same region.

Fourth Embodiment

Correction of IR Drop

The display device 1 according to this embodiment may be the same in configuration as the display device 1 according to any of the previous embodiments. A method for controlling the display device 1 according to this embodiment is implemented by partially modifying the method for controlling the display device 1 according to any of the previous embodiments.

Figure 8:
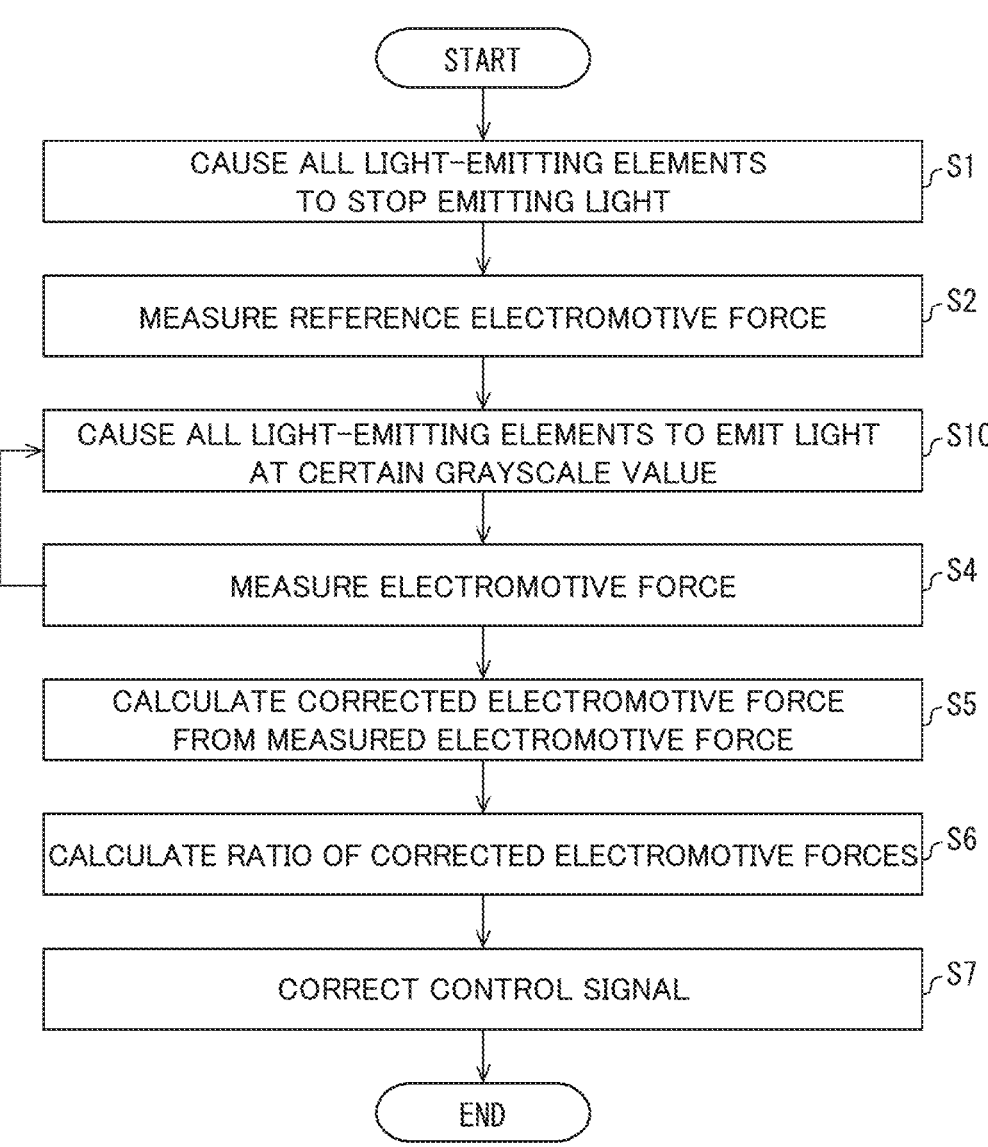
FIG. 8 shows a flowchart showing an example of a method for controlling a display device according to a fourth embodiment.

Described below will be an exemplary method for controlling the display device 1 according to this embodiment, with reference to FIG. 8. FIG. 8 shows a flowchart showing an example of a method for controlling the display device 1 according to this embodiment. The method for controlling the display device 1 shown in FIG. 8 includes a method for correcting an IR drop of the display panel 2 through correction of a control signal by the control unit 5. The method for correcting an IR drop will be described later in detail.

In the method for controlling the display device 1 shown in FIG. 8, first, the same steps as Step S1 and Step S2 according to the above embodiments are sequentially carried out, and the measuring unit 4 measures a reference electromotive force.

Next, in the method for controlling the display device 1 according to this embodiment, all the light-emitting elements included in the display panel 2 are caused to emit light at a predetermined grayscale value (Step S10). For example, the control unit 5 applies a control signal having a predetermined intensity to drive circuits each corresponding to one of all the light-emitting elements included in the display panel 2, in order to cause all the light-emitting elements included in the display panel 2 to emit light at a grayscale value corresponding to the intensity. More specifically, the control unit 5 causes all the light-emitting elements of the display panel 2 to emit light at a predetermined grayscale value; that is, a first grayscale value.

Next, using the same method carried out at Step S4 according to the previous embodiment, the measuring unit 4 measures an electromotive force generated in the solar cell 3. The electromotive force corresponds to a first grayscale electromotive force including the reference electromotive force described above and additionally including an electromotive force generated when light from each of the light-emitting elements of the display panel 2 reaches the photoactive layer 33 of the solar cell 3. Here, the light is emitted at the first grayscale value from all the light-emitting elements of the display panel 2. The first grayscale electromotive force may be stored in the storage unit 42.

After that, Step S10 and Step S4 are repeatedly executed while the control unit 5 changes the grayscale values of light to be emitted from the light-emitting elements. For example, in this embodiment, following the measurement of the first grayscale electromotive force, each of the light-emitting elements is caused to emit light at a second grayscale value different from the first grayscale value, and a second grayscale electromotive force is measured.

Step S10 and Step S4 may be repeatedly executed until electromotive forces are measured for all the light-emitting elements caused to emit light at all the grayscale values previously determined. The electromotive forces measured at Step S4 may be sequentially stored in the storage unit 42.

After all the light-emitting elements emit light at all the grayscale values and the electromotive forces are measured, the arithmetic unit 43 of the measuring unit 4 calculates a corrected electromotive force obtained by subtracting the reference electromotive force from each of the measured electromotive forces, using the same method performed at Step S5 according to the previous embodiments. For example, the arithmetic unit 43 calculates a first grayscale corrected electromotive force and a second grayscale corrected electromotive force each obtained by subtracting the corrected electromotive force from the respective electromotive forces.

Next, the comparing unit 44 compares the corrected electromotive forces and calculates a ratio of the corrected electromotive forces, using the same method performed at Step S6 according to the previous embodiment. For example, the comparing unit 44 calculates a ratio of the first grayscale corrected electromotive force to the second grayscale corrected electromotive force. Because of the same reasons described in the previous embodiment, the ratio approximately corresponds to a ratio of a sum of emission intensities of the light-emitting elements caused to emit light at each of the first grayscale value and the second grayscale value.

Next, in accordance with the measurement by the measuring unit 4, the control unit 5 corrects, in the same manner at Step S7 according to the previous embodiments, a control signal to be applied to a drive circuit of a corresponding one of the light-emitting elements of the display panel 2. For example, the control unit 5 corrects the control signal so that the ratio of the corrected electromotive forces calculated at Step S6 is close to a predetermined ratio.

For example, the storage unit 42 stores the ratio of the first grayscale corrected electromotive force to the second grayscale corrected electromotive force, the ratio being previously measured at the time of shipment. Furthermore, the control unit 5 corrects intensity of a control signal to be applied to a light-emitting element positioned in each region so that a ratio of the first grayscale corrected electromotive force to the second grayscale corrected electromotive force at present time is close to the ratio of those previously determined.

Exemplary Correction of IR Drop

At Step S7 of this embodiment, the control unit 5 corrects an IR drop of the display panel 2 through the correction of the control signal. The correction of the IR drop of the display panel 2 by the control unit 5 will be described in more detail with reference to FIG. 9. FIG. 9 illustrates graphs showing an exemplary relationship between a corrected electromotive force and a grayscale value of each of the light-emitting elements according to this embodiment.

A graph G4 illustrated in FIG. 9 is a graph showing an ideal value and an actual value of a corrected electromotive force observed when the display panel 2 has a gamma factor of 2.2. The ideal value and the actual value are indicated by any given unit for each of the grayscale values of the light-emitting element. In the graph G4, the thick line indicates a measured value of the corrected electromotive force, and the thin line indicates an ideal value of the corrected electromotive force.

A graph G5 is a graph showing a corrected electromotive force measured after the control unit 5 has corrected the control signal in accordance with a measured value of the corrected electromotive force shown in the graph G4. The corrected electromotive force is indicated by any given unit for each of the grayscale values of the light-emitting element. In the graph G5, the thin line indicates a measured value of the corrected electromotive force before correction, as the thick line indicates in the graph G4. The thick line indicates a measured value of the corrected electromotive force after correction.

Each of the graphs in FIG. 9 shows each corrected electromotive force observed when the grayscale value of the light-emitting element is varied from 0 to 255. Furthermore, in each of the graphs in FIG. 9, E(255) represents a measured value of the corrected electromotive force observed when each of the light-emitting elements is set to a maximum grayscale value of 255.

For example, as the graph G4 shows, a measured value of the corrected electromotive force observed when the light-emitting element is caused to emit light at a low grayscale is not so different from an ideal value of the corrected electromotive force. This shows that, when the light-emitting element emits light at a low grayscale, the emission intensity of the light-emitting element is not so different from assumed ideal emission intensity.

Whereas, as the graph G4 shows, the higher the grayscale is for the light-emitting element to emit light, the lower the measured value of the corrected electromotive force tends to be than the ideal value of the corrected electromotive force. This shows that the higher the grayscale is for the light-emitting element to emit light, the lower the emission intensity of the light-emitting element tends to be than the assumed ideal emission intensity.

Typically, when a predetermined voltage is applied to an injection light-emitting element, a density of current running in the light-emitting element drops below an ideal value; that is, an IR drop occurs. The IR drop is due to, for example, resistance of either a driver circuit, or a wire, connected to the light-emitting element. Typically, the IR drop appears more apparently as the control signal to be applied to the light-emitting element exhibits higher intensity; that is, the light-emitting element is driven at a higher grayscale.

In this embodiment, the control unit 5 corrects the intensity of a control signal for driving each of the light-emitting elements of the display panel 2, in order to correct the IR drop of each of the light-emitting elements of the display panel 2. For example, with reference to intensity of a control signal corresponding to the highest grayscale value, which causes the largest degree of reduction in emission intensity by the IR drop, the control unit 5 reduces intensity of a control signal corresponding to another grayscale value, in order to perform the correction.

For example, with reference to intensity of a control signal corresponding to a grayscale value of 255, the control unit 5 reduces intensity of a control signal corresponding to each of the grayscale values. Hence, as the thick line of the graph G5 shows, the control unit 5 can correct the control signal, so that a ratio of the emission intensities of each of the light-emitting elements at the respective grayscale values is close to an ideal ratio. More specifically, the control unit 5 corrects the control signal. After that, a corrected electromotive force (the thick line in the graph G5) is measured for each of the grayscale values. The corrected electromotive force represents a curve observed when the display panel 2 has a gamma factor of 2.2, as represented by the ideal value (the thin line in the graph G4) of the corrected electromotive force for each of the grayscale values.

At Step S7, the control unit 5 corrects a control signal. After that, in accordance with the corrected control signal, the control unit 5 controls display of the display panel 2. Thanks to the method for controlling the display device 1 according to this embodiment, the display device 1 allows the control unit 5 to more appropriately execute display control of the display panel 2, thereby successfully improving display quality of the display panel 2.

The IR drop might occur regardless of time-related deterioration of the light-emitting elements. For example, the IR drop might occur even when the display device 1 is shipped. Hence, the method for controlling the display device 1 according to this embodiment may be executed in, for example, a product test at the time when the display device 1 is shipped.

Fifth Embodiment

Correction of IR Drop, Taking Lighting Rate into Consideration

The display device 1 according to this embodiment may be the same in configuration as the display device 1 according to any of the previous embodiments. A method for controlling the display device 1 according to this embodiment is implemented by partially modifying the method for controlling the display device 1 according to the previous embodiment.

Described below will be an exemplary method for controlling the display device 1 according to this embodiment, with reference to FIG. 10. FIG. 10 shows a flowchart showing an example of a method for controlling the display device 1 according to this embodiment. The method for controlling the display device 1 shown in FIG. 10 includes a method for correcting an IR drop of the display panel 2 through correction of a control signal by the control unit 5, taking a lighting rate of the display panel 2 into consideration. The IR drop will be described later in detail.

In the method for controlling the display device 1 shown in FIG. 10, the same steps of controlling the display device 1 according to the previous embodiments are executed until Step S4. Thus, for all the predetermined grayscale values, the measuring unit 4 measures electromotive forces observed when all the light-emitting elements emit light. For example, the measuring unit 4 measures the first grayscale electromotive force and the second grayscale electromotive force described above.

Next, in the method for controlling the display device 1 according to this embodiment, a portion of the light-emitting elements alone included in the display panel 2 are caused to emit light at a predetermined grayscale value (Step S11). For example, the control unit 5 applies a control signal having a predetermined intensity to a drive circuit of a corresponding one of a portion of the light-emitting elements included in the display panel 2. Thus, the control unit 5 causes the portion of the light-emitting elements included in the display panel 2 to emit light at a grayscale value corresponding to the intensity. More specifically, the control unit 5 causes the portion of the light-emitting elements included in the display panel 2 to emit light at a predetermined grayscale value; that is, the first grayscale value.

Next, using the same method carried out at Step S4 according to the previous embodiments, the measuring unit 4 measures an electromotive force generated in the solar cell 3. The electromotive force corresponds to a third grayscale electromotive force including the reference electromotive force described above and additionally including an electromotive force generated when light from each of the light-emitting elements of the display panel 2 reaches the photoactive layer 33 of the solar cell 3. Here, the light is emitted at the first grayscale value from the portion of the light-emitting elements of the display panel 2. The third grayscale electromotive force may be stored in the storage unit 42.

Next, Step S11 and Step S4 may be executed again, changing not the light-emitting elements caused to emit light by the control unit 5 but the grayscale values of the light-emitting elements. For example, in this embodiment, following the measurement of the third grayscale electromotive force, each of the light-emitting elements is caused to emit light at the second grayscale value different from the first grayscale value, and a fourth grayscale electromotive force is measured.

Step S11 and Step S4 may be repeatedly executed until electromotive forces are measured for the portion of the light-emitting elements caused to emit light at all the grayscale values previously determined. Furthermore, in this embodiment, the number of light-emitting elements caused to emit light at Step S11 is changed, and, simultaneously, Step S11 and Step S4 may be executed to cause the light-emitting elements to emit light at a predetermined grayscale value and the grayscale electromotive forces may be measured.

Described below will be a method for selecting a light-emitting element to emit light at Step S11, with reference to FIG. 11. A schematic view 2D, a schematic view 2E, and a schematic view 2F of the display panel 2 illustrated in FIG. 11 show a plurality of pixels in the display region of the display panel 2 in a plan view. For example, each of the pixels may be formed in a region including one red light-emitting element 22R, one green light-emitting element 22G, and one blue light-emitting element 22B in the display region of the display panel 2.

In this case, all the light-emitting elements included in each pixel emit light, such that the pixel releases a white light that is a mixture of a red light from the red light-emitting element 22R, a green light from the green light-emitting element 22G, and a blue light from the blue light-emitting element 22B. In other words, when all the light-emitting elements included in each pixel emit light, the pixel serves as a white pixel PW illustrated in the schematic view 2E and the schematic view 2F. Whereas, when all the light-emitting elements included in each pixel stop emitting light, the pixel serves as a black pixel PB illustrated in the schematic view 2D, the schematic view 2E and the schematic view 2F.

Each of the schematic view 2D, the schematic view 2E, and the schematic view 2F of the display panel 2 illustrated in FIG. 11 shows an example of how either white pixels PW or black pixels BW are arranged when a lighting rate of the display panel 2 is respectively 100%, 50%, and 25%.

In this embodiment, for example, at Step S10, the lighting rate of the display panel 2 is 100%. As shown in the schematic view 2D, all the pixels of the display panel 2 are the white pixels PW.

In this embodiment, for example, at Step S11, the lighting rate of the display panel 2 is 50%. As shown in the schematic view 2E, a half of the pixels of the display panel 2 may be the white pixels PW, and the other half of the pixels may be the black pixels PB. Here, as illustrated in the schematic view 2E, the white pixels PW of the display panel 2 may be arranged not adjacent to the black pixels PB in the vertical and horizontal directions of the display panel 2.

In this embodiment, for example, at Step S11, the lighting rate of the display panel 2 may be 25%. As shown in the schematic view 2E, a quarter of the pixels of the display panel 2 may be the white pixels PW, and the other three quarters of the pixels may be the black pixels PB. Here, as illustrated in the schematic view 2F, the white pixels PW of the display panel 2 may be arranged to be surrounded with the black pixels PB in the plan view of the display panel 2. In other words, each of the white pixels PW of the display panel 2 may be disposed not adjacent to the other white pixels PW in an orthogonal direction of the display panel 2.

Suppose that the light-emitting elements are caused to emit light, and the electromotive forces are measured at Step S4 at all the grayscale values and in all the combinations of the light-emitting elements caused to emit light. In this case, next, the arithmetic unit 43 of the measuring unit 4 calculates a corrected electromotive force obtained by subtracting the reference electromotive force from each of the measured electromotive forces, using the same method performed at Step S5 according to the previous embodiments. For example, the arithmetic unit 43 calculates the first grayscale corrected electromotive force, the second grayscale corrected electromotive force, a third grayscale corrected electromotive force, and a fourth grayscale corrected electromotive force each obtained by subtracting the corrected electromotive force from the respective electromotive forces.

Next, the comparing unit 44 compares the corrected electromotive forces and calculates a ratio of the corrected electromotive forces, using the same method performed at Step S6 according to the previous embodiments. For example, the comparing unit 44 calculates a ratio of the first grayscale corrected electromotive force to the second grayscale corrected electromotive force to the third grayscale corrected electromotive force to the fourth grayscale corrected electromotive force. The ratio approximately corresponds to a sum of emission intensities of all the light-emitting elements caused to emit light at each of the first grayscale value and the second grayscale value, and to a sum of emission intensities of a portion of the light-emitting elements caused to emit light at the first grayscale value and the second grayscale value.

Next, in accordance with the measurement by the measuring unit 4, the control unit 5 corrects, in the same manner at Step S7 according to the previous embodiment, a control signal to be applied to a drive circuit of a corresponding one of the light-emitting elements of the display panel 2. For example, the control unit 5 corrects the control signal so that the ratio of the corrected electromotive forces calculated at Step S6 is close to a predetermined ratio.

For example, the storage unit 42 stores the ratio of the first grayscale corrected electromotive force to the second grayscale corrected electromotive force to the third grayscale corrected electromotive force to the fourth grayscale corrected electromotive force, the ratio being predetermined at the time of shipment. Furthermore, the control unit 5 corrects intensity of a control signal to be applied to a light-emitting element positioned in each region so that the ratio of the first grayscale corrected electromotive force to the second grayscale corrected electromotive force to the third grayscale corrected electromotive force to the fourth grayscale corrected electromotive force at present time is close to the ratio of those previously determined above.

Exemplary Correction of IR Drop, Taking Lighting Rate into Consideration

At Step S7 of this embodiment, the control unit 5 corrects the IR drop of the display panel 2 through the correction of the control signal, taking the lighting rate of the display panel 2 into consideration. The correction of the IR drop of the display panel 2 by the control unit 5 will be described in more detail with reference to FIG. 12, taking the lighting rate of the display panel 2 into consideration.

A graph G6 in FIG. 12 is a graph showing measured values of the corrected electromotive forces observed when the lighting rates of the display panel 2 are 100%, 50%, and 25%. The measured values are indicated by any given unit for each of the grayscale values of the light-emitting element. A graph G7 in FIG. 12 is a graph showing the measured values in the graph G6. Each of the measured values is standardized so that corrected electromotive forces at a certain predetermined grayscale value take the same value. For example, the graph G7 is a graph in which each of the measured values is standardized while a grayscale value denoted by a black dot is set as a reference.

The graph G7 shows that the higher the lighting rate of the display panel 2 is, the higher the proportion of the IR drop is at a high grayscale. Typically, when the IR drop occurs to a display device including a plurality of injection light-emitting elements, the IR drop appears more apparently as the light-emitting elements to be driven are provided in larger number. This is because the larger the number of the light-emitting elements to be driven is, the more the wiring and the driver circuits are involved in the IR drop.

In this embodiment, the control unit 5 corrects the intensity of a control signal for driving each of the light-emitting elements of the display panel 2, in order to correct the IR drop of each of the light-emitting elements of the display panel 2 in accordance with the lighting rate of the display panel 2. In other words, the control unit 5 corrects the intensity of a control signal, depending either on the number of the light-emitting elements, or on the number of pixels, caused to emit light for the display panel 2 to display an image.

For example, the control unit 5 individually corrects the intensity of the control signal in a case where the lighting rate is 100%, 50%, and 25%. At each lighting rate, the control unit 5 may correct the intensity of the control signal by the same method described in the previous embodiments. In other words, the control unit 5 may set, as a reference, intensity of a control signal corresponding to a highest grayscale value observed if the lighting rate is 100%, which causes the largest degree of reduction in emission intensity by the IR drop. In this case, with reference to the intensity, the control unit 5 may reduce intensity of a control signal corresponding to another lighting rate and another grayscale value, in order to perform the correction.

At Step S7, the control unit 5 corrects a control signal. After that, in accordance with the corrected control signal, the control unit 5 controls display of the display panel 2. Thanks to the method for controlling the display device 1 according to this embodiment, the display device 1 allows the control unit 5 to more appropriately execute display control of the display panel 2, thereby successfully improving display quality of the display panel 2.

Sixth Embodiment

Example of How Human Body is Wearing Display Device

This embodiment describes an example of the display device 1 wearable on a human body, with reference to FIG. 13. FIG. 13 illustrates a schematic view showing an example of how a human body is wearing the display device 1. In particular, FIG. 13 illustrates an example of how an arm X of the human body is wearing the display device 1. Note that the display device 1 according to this embodiment may be wearable either on the arm X or on another portion of the human body. Alternatively, the display device 1 may be wearable on another living body other than a human body.

As illustrated in FIG. 13, the display device 1 of this embodiment may include a housing H containing therein at least the display panel 2 and the solar cell 3. The housing H may be secured to the arm X with an adhesive. Alternatively, the housing H may include a band B to secure the housing H to the arm X. Here, the housing H is secured to the arm X in such a manner that, for example, the solar cell 3 is closer to the arm X than the display panel 2. For example, the display panel 2 may display an image by emitting light from each of the light-emitting elements out of the housing H through either a light-transparent portion or an opening portion provided to the housing H to transmit visible light.

Note that each of the measuring unit 4, the control unit 5, the power storage unit 6, and the power supply 7, which are not shown in FIG. 13, may be either housed in, or positioned out of, the housing H. Signals and power may be exchanged between the inside and outside of the housing H through, for example, a not-shown transmitter and a not-shown receiver.

In this embodiment, the photoactive layer 33 of the solar cell 3 is sensitive to an infrared ray. The photoactive layer 33 sensitive to an infrared ray contains, for example, the above-described infrared quantum dots QDA absorbing an infrared ray and serving as a light-receiving material. For example, the solar cell 3 receives, with the photoactive layer 33, an infrared ray entering from the outside of the housing H through either a light-transparent portion or an opening portion provided to the housing H to transmit the infrared ray. For example, the solar cell 3 receives an infrared ray emitted from the human body. Furthermore, the solar cell 3 receives an infrared ray to generate power.

Moreover, in this embodiment, through measurement of the output from the solar cell 3, the measuring unit 4 measures intensity of the infrared ray received with the solar cell 3. The measuring unit 4 may measure an electromotive force generated in the solar cell 3 when the solar cell 3 receives the infrared ray, using, for example, the same method as described above. Here, in order to reduce an influence of light from each of the light-emitting elements of the display panel 2, the control unit 5 may stop displaying an image on the display panel 2 when the measuring unit 4 measures the intensity of the above infrared ray.

Other than the above-described features, the display device 1 according to this embodiment may be the same in configuration as the display device 1 according to any of the previous embodiments.

The display device 1 according to this embodiment can measure the intensity of the infrared ray received with the solar cell 3. Hence, through the measurement of the intensity of the above infrared ray, the display device 1 can determine whether the display device 1 is worn on a living body of, for example, a human, or can measure the temperature around the display device 1 such as body temperature. Furthermore, the display device 1 generates power with an infrared ray received with the solar cell 3 and uses the generated power to operate the units, thereby successfully reducing power consumption.

In addition, the display device 1 according to this embodiment may allow the control unit 5 to correct a control signal, using the method for controlling the display device 1 according to any one of the previous embodiments. Furthermore, in this embodiment, the reference electromotive force contains an electromotive force generated when the solar cell 3 receives an infrared ray. Hence, this embodiment can remove the influence of the infrared ray received with the solar cell 3 from a corrected electromotive force that the control unit 5 uses to correct a control signal.

Seventh Embodiment

Modifications of Display Panel and Solar Cell

Figure 14:
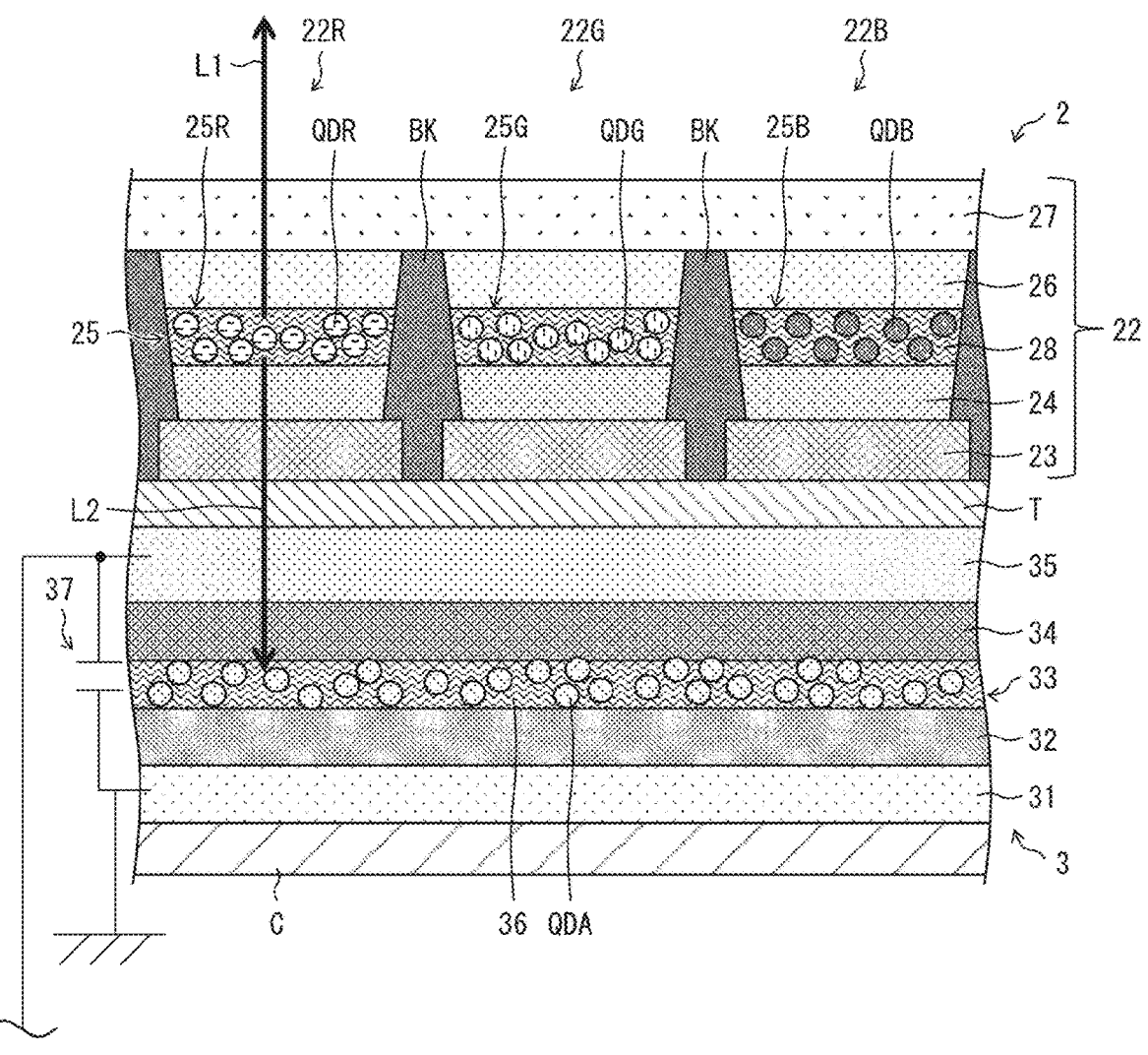
FIG. 14 illustrates schematic sectional side views of a display panel and a solar cell according a seventh embodiment.

Described below will be the display device 1 according to this embodiment, with reference to FIG. 14. FIG. 14 illustrates an example of schematic sectional side views of the display panel 2 and the solar cell 3 according to this embodiment, and shows cross-sections corresponding to the schematic sectional views of the display panel 2 and the solar cell 3 illustrated in FIG. 2.

In this embodiment, the display device 1 includes the solar cell 3 and the display panel 2 provided in the stated order above the substrate C. For example, the display device 1 may include a transparent insulating layer T between the display panel 2 and the solar cell 3. The transparent insulating layer T may be in contact with the light-emitting element layer 22 of the display panel 2 and the solar cell 3.

Otherwise, the display device 1 according to this embodiment may be the same in configuration as the display device 1 according to any of the previous embodiments.

For example, each of the drive circuits formed on the substrate C is connected to a corresponding one of the cathodes 23 of the display panel 2 through wiring either routed around the solar cell 3 or formed in a contact hole penetrating the layers of the solar cell 3. Hence, the control unit 5 applies a control signal to each of the drive circuits, in order to control light to be emitted from each of the light-emitting elements of the display panel 2 and to control the display panel 2 displaying an image.

Furthermore, the light from each of the light-emitting elements of the display panel 2 passes through the transparent insulating layer T, and reaches the photoactive layer 33 of the solar cell 3. Hence, also in this embodiment, the method for controlling the display device 1 according to any of the previous embodiments allows the control unit 5 to correct a control signal.

In this embodiment, the display device 1 has the substrate C provided across the solar cell 3 from the display panel 2. Here, the substrate C includes the drive circuits for driving the respective light-emitting elements of the display panel 2. Hence, the display device 1 allows the light from each of the light-emitting elements of the display panel 2 to more efficiently reach the photoactive layer 33 of the solar cell 3. Thus, the display device 1 can increase the amount of power generated by the solar cell 3 using the light from each of the light-emitting elements of the display panel 2, and, furthermore, cause the control unit 5 to correct more accurately a control signal through the measurement of the output from the solar cell 3.

In this embodiment, the substrate C may contain a light-transparent member as described above, and light from the outside of the display device 1 may pass through the substrate C and reach the photoactive layer 33 of the solar cell 3. In this case, the display device 1 can use power, which is generated of light entering the solar cell 3, to operate the units, thereby successfully reducing power consumption.

Whereas, in this embodiment, the substrate C may be formed of a light-blocking member alone, and may block light. In this case, the substrate C is not positioned between the display panel 2 and the solar cell 3. Hence, the display device 1 allows the light from each of the light-emitting elements of the display panel 2 to reach the photoactive layer 33 of the solar cell 3. Thus, the display device 1 according to this embodiment allows the substrate C to be designed more freely to have a more simplified structure.

Note that, in each of the first to fifth embodiments and the seventh embodiment of the present disclosure, the photoactive layer 33 of the solar cell 3 may be either sensitive or insensitive to an infrared ray.

In each of the embodiments of the present disclosure, the measuring unit 4 and the control unit 5 may be implemented in the form of computers. Furthermore, the scope of the present disclosure includes: a control program of the display device 1 for causing the computer to operate as the measuring unit 4 and the control unit 5 according to each embodiment of the present disclosure; and a computer-readable recording medium recording the control program.

The present disclosure shall not be limited to the embodiments described above, and can be modified in various manners within the scope of claims. The technical aspects disclosed in different embodiments are to be appropriately combined together to implement another embodiment. Such an embodiment shall be included within the technical scope of the present disclosure. Moreover, the technical aspects disclosed in each embodiment may be combined together to achieve a new technical feature.

The invention claimed is:

1. A display device, comprising:
a display panel comprising a plurality of light-emitting elements, the plurality of light-emitting elements comprising first light-emitting elements configured to emit light in a first color, and second light-emitting elements configured to emit light in a second color different from the first color;
at least one solar cell configured to receive light from the plurality of light-emitting elements;
a measuring unit configured to measure an output from the at least one solar cell; and
a control unit configured to individually control emission of light from the plurality of light-emitting elements using one or more control signals,
wherein:
the measuring unit is further configured to measure a reference electromotive force that is an electromotive force generated by the solar cell and observed when the control unit causes the plurality of light-emitting elements to stop emitting light, and to measure a first electromotive force and a second electromotive force, both of which are electromotive forces of the solar cell, the first electromotive force being observed when the control unit causes all the first light-emitting elements alone to emit light, and the second electromotive force being observed when the control unit causes all the second light-emitting elements alone to emit light, and
the control unit corrects a control signal corresponding to at least one of the plurality of light-emitting elements in accordance with one or more measurements performed by the measuring unit, such that a ratio of a first corrected electromotive force to a second corrected electromotive force at present time is close to a ratio of the first corrected electromotive force to the second corrected electromotive force at a time of shipment, the first corrected electromotive force being obtained by subtracting the reference electromotive force from the first electromotive force, and the second corrected electromotive force being obtained by subtracting the reference electromotive force from the second electromotive force.

2. The display device according to claim 1,
wherein the control unit individually controls an intensity of light emitted from the plurality of light-emitting elements in accordance with at least a first grayscale value, and a second grayscale value different from the first grayscale value,
the measuring unit further measures a first grayscale electromotive force and a second grayscale electromotive force, both of which are electromotive forces of the solar cell, the first grayscale electromotive force being observed when the control unit causes all of the plurality of the light-emitting elements to emit light in accordance with the first grayscale value, and the second grayscale electromotive force being observed when the control unit causes all of the plurality of the light-emitting elements to emit light in accordance with the second grayscale value, and the control unit further corrects the control signal corresponding to at least one of the plurality of light-emitting elements so that a ratio of a first grayscale corrected electromotive force to a second grayscale corrected electromotive force at present time is close to a previously determined ratio of the first grayscale corrected electromotive force to the second grayscale corrected electromotive force, the first grayscale corrected electromotive force being obtained by subtracting the reference electromotive force from the first grayscale electromotive force, and the second grayscale corrected electromotive force being obtained by subtracting the reference electromotive force from the second grayscale electromotive force.

3. The display device according to claim 2, wherein the measuring unit further measures a third grayscale electromotive force and a fourth grayscale electromotive force, both of which are electromotive forces of the solar cell, the third grayscale electromotive force being observed when the control unit causes a portion of the plurality of light-emitting elements to emit light in accordance with the first grayscale value, and the fourth grayscale electromotive force being observed when the control unit causes the portion of the plurality of light-emitting elements to emit light in accordance with the second grayscale value, and the control unit further corrects the control signal corresponding to at least one of the plurality of light-emitting elements so that a ratio of the first grayscale corrected electromotive force to the second grayscale corrected electromotive force to a third grayscale corrected electromotive force to a fourth grayscale corrected electromotive force at present time is close to a previously determined ratio of the first grayscale corrected electromotive force to the second grayscale corrected electromotive force to the third grayscale corrected electromotive force to the fourth grayscale corrected electromotive force, the third grayscale corrected electromotive force being obtained by subtracting the reference electromotive force from the third grayscale electromotive force, and the fourth grayscale corrected electromotive force being obtained by subtracting the reference electromotive force from the fourth grayscale electromotive force.

4. A display device, comprising:

a display panel comprising a plurality of light-emitting elements, the plurality of light-emitting elements comprising a plurality of first region light-emitting elements formed in a first region that is a first portion of a display region in the display panel, and a plurality of second region light-emitting elements formed in a second region that is a second portion of the display region in the display panel, the second region being different from the first region;

at least one solar cell configured to receive light from the plurality of light-emitting elements;

a measuring unit configured to measure an output from the at least one solar cell; and a control unit configured to individually control emission of light from the plurality of light-emitting elements using one or more control signals, wherein:

the measuring unit is further configured to measure a reference electromotive force that is an electromotive force generated by the solar cell and observed when the control unit causes all of the plurality of the light-emitting elements to stop emitting light, and to measure a third electromotive force and a fourth electromotive force, both of which are electromotive forces of the solar cell, the third electromotive force being observed when the control unit causes all the first region light-emitting elements alone to emit light, and the second electromotive force being observed when the control unit causes all the second region light-emitting elements alone to emit light, and the control unit corrects a control signal corresponding to at least one of the plurality of light-emitting elements in accordance with one or more measurements by the measuring unit, so that a ratio of a third corrected electromotive force to a fourth corrected electromotive force at present time is close to a ratio of the third corrected electromotive force to the fourth corrected electromotive force at time of shipment, the third corrected electromotive force being obtained by subtracting the reference electromotive force from the third electromotive force, and the fourth corrected electromotive force being obtained by subtracting the reference electromotive force from the fourth electromotive force.

5. The display device according to claim 4, wherein the control unit individually controls an intensity of light emitted from the light-emitting elements in accordance with at least a first grayscale value and a second grayscale value different from the first grayscale value, the measuring unit further measures a first grayscale electromotive force and a second grayscale electromotive force, both of which are electromotive forces of the solar cell, the first grayscale electromotive force being observed when the control unit causes all of the plurality of the light-emitting elements to emit light in accordance with the first grayscale value, and the second grayscale electromotive force being observed when the control unit causes all of the plurality of the light-emitting elements to emit light in accordance with the second grayscale value, and the control unit further corrects the control signal corresponding to at least one of the plurality of light-emitting elements so that a ratio of a first grayscale corrected electromotive force to a second grayscale corrected electromotive force at present time is close to a previously determined ratio of the first grayscale corrected electromotive force to the second grayscale corrected electromotive force, the first grayscale corrected electromotive force being obtained by subtracting the reference electromotive force from the first grayscale electromotive force, and the second grayscale corrected electromotive force being obtained by subtracting the reference electromotive force from the second grayscale electromotive force.

6. The display device according to claim 5, wherein the measuring unit further measures a third grayscale electromotive force and a fourth grayscale electromotive force, both of which are electromotive forces of the solar cell, the third grayscale electromotive force being observed when the control unit causes a portion of the plurality of the light-emitting elements to emit light in accordance with the first grayscale value, and the fourth grayscale electromotive force being observed when the control unit causes the portion of the plurality of the light-emitting elements to emit light in accordance with the second grayscale value, and the control unit further corrects the control signal corresponding to at least one of the plurality of the light-emitting elements so that a ratio of the first grayscale corrected electromotive force to the second grayscale corrected electromotive force to a third grayscale corrected electromotive force to a fourth grayscale corrected electromotive force at present time is close to a previously determined ratio of the first grayscale corrected electromotive force to the second grayscale corrected electromotive force to the third grayscale corrected electromotive force to the fourth grayscale corrected electromotive force, the third grayscale corrected electromotive force being obtained by subtracting the reference electromotive force from the third grayscale electromotive force, and the fourth grayscale corrected electromotive force being obtained by subtracting the reference electromotive force from the fourth grayscale electromotive force.

7. A display device, comprising:

a display panel comprising a plurality of light-emitting elements, the light-emitting elements comprising:

a plurality of first region light-emitting elements formed in a first region that is a first portion of a display region in the display panel, the first region light-emitting elements comprising fifth light-emitting elements configured to emit light in a first color, and sixth light-emitting elements configured to emit light in a second color different from the first color, and a plurality of second region light-emitting elements formed in a second region that is a second portion of the display region in the display panel, the second region being different from the first region, the second region light-emitting elements comprising seventh light-emitting elements configured to emit light in the first color, and eighth light-emitting elements configured to emit light in the second color different from the first color;

at least one solar cell configured to receive light from the plurality of light-emitting elements;

a measuring unit configured to measure an output from the at least one solar cell; and a control unit configured to individually control emission of light from the plurality of light-emitting elements using one or more control signals, wherein:

the measuring unit is further configured to measure a reference electromotive force that is an electromotive force generated by the solar cell and observed when the control unit causes all of the plurality of the light-emitting elements to stop emitting light, and to measure a fifth electromotive force, a sixth electromotive force, a seventh electromotive force, and an eighth electromotive force, all of which are electromotive forces of the solar cell, the fifth electromotive force being observed when the control unit causes all the fifth light-emitting elements alone to emit light, the sixth electromotive force being observed when the control unit causes all the sixth light-emitting elements alone to emit light, the seventh electromotive force being observed when the control unit causes all the seventh light-emitting elements alone to emit light, and the eighth electromotive force being observed when the control unit causes all the eighth light-emitting elements alone to emit light, and the control unit corrects a control signal corresponding to at least one of the plurality of light-emitting elements in accordance with one or more measurements by the measuring unit, so that a ratio of a fifth corrected electromotive force to a sixth corrected electromotive force to a seventh corrected electromotive force to an eighth corrected electromotive force at present time is close to a ratio of the fifth corrected electromotive force to the sixth corrected electromotive force to the seventh corrected electromotive force to the eighth corrected electromotive force at time of shipment, the fifth corrected electromotive force being obtained by subtracting the reference electromotive force from the fifth electromotive force, the sixth corrected electromotive force being obtained by subtracting the reference electromotive force from the sixth electromotive force, the seventh corrected electromotive force being obtained by subtracting the reference electromotive force from the seventh electromotive force, and the eighth corrected electromotive force being obtained by subtracting the reference electromotive force from the eighth electromotive force.

8. The display device according to claim 7, wherein the control unit individually controls an intensity of light emitted from the plurality of the light-emitting elements in accordance with at least a first grayscale value and a second grayscale value different from the first grayscale value, the measuring unit further measures a first grayscale electromotive force and a second grayscale electromotive force, both of which are electromotive forces of the solar cell, the first grayscale electromotive force being observed when the control unit causes all the plurality of the light-emitting elements to emit light in accordance with the first grayscale value, and the second grayscale electromotive force being observed when the control unit causes all the plurality of the light-emitting elements to emit light in accordance with the second grayscale value, and the control unit further corrects the control signal corresponding to at least one of the plurality of the light-emitting elements so that a ratio of a first grayscale corrected electromotive force to a second grayscale corrected electromotive force at present time is close to a previously determined ratio of the first grayscale corrected electromotive force to the second grayscale corrected electromotive force, the first grayscale corrected electromotive force being obtained by subtracting the reference electromotive force from the first grayscale electromotive force, and the second grayscale corrected electromotive force being obtained by subtracting the reference electromotive force from the second grayscale electromotive force.

9. The display device according to claim 8, wherein the measuring unit further measures a third grayscale electromotive force and a fourth grayscale electromotive force, both of which are electromotive forces of the solar cell, the third grayscale electromotive force being observed when the control unit causes a portion of the plurality of the light-emitting elements to emit light in accordance with the first grayscale value, and the fourth grayscale electromotive force being observed when the control unit causes the portion of the plurality of the light-emitting elements to emit light in accordance with the second grayscale value, and the control unit further corrects the control signal corresponding to at least one of the plurality of the light-emitting elements so that a ratio of the first grayscale corrected electromotive force to the second grayscale corrected electromotive force to a third grayscale corrected electromotive force to a fourth grayscale corrected electromotive force at present time is close to a previously determined ratio of the first grayscale corrected electromotive force to the second grayscale corrected electromotive force to the third grayscale corrected electromotive force to the fourth grayscale corrected electromotive force, the third grayscale corrected electromotive force being obtained by subtracting the reference electromotive force from the third grayscale electromotive force, and the fourth grayscale corrected electromotive force being obtained by subtracting the reference electromotive force from the fourth grayscale electromotive force.

* * * * *